United States Patent
Varel et al.

(10) Patent No.: US 10,620,250 B2
(45) Date of Patent: Apr. 14, 2020

(54) LOCALIZED FREE SPACE TESTER

(71) Applicant: Kymeta Corporation, Redmond, WA (US)

(72) Inventors: Cadgas Varel, Seattle, WA (US); Ryan Stevenson, Woodinville, WA (US); Steven Linn, Hillsboro, OR (US); Michael Severson, Seattle, WA (US); Colin Stuart Short, Redmond, WA (US); Mohsen Sazegar, Kirkland, WA (US)

(73) Assignee: KYMETA CORPORATION, Redmond, WA (US)

(*) Notice: Subject to any disclaimer, the term of this patent is extended or adjusted under 35 U.S.C. 154(b) by 0 days.

(21) Appl. No.: 16/247,879

(22) Filed: Jan. 15, 2019

(65) Prior Publication Data
US 2019/0219623 A1 Jul. 18, 2019

Related U.S. Application Data

(60) Provisional application No. 62/618,487, filed on Jan. 17, 2018.

(51) Int. Cl.
*G01R 29/08* (2006.01)
*H04B 17/17* (2015.01)
(Continued)

(52) U.S. Cl.
CPC ..... *G01R 29/0871* (2013.01); *G01R 29/0878* (2013.01); *G01R 29/10* (2013.01);
(Continued)

(58) Field of Classification Search
CPC ........ G01R 29/0871; G01R 29/0878; G01R 29/10; H04B 17/12; H04B 17/17; H04B 17/21
(Continued)

(56) References Cited

U.S. PATENT DOCUMENTS 6,285,330 B1 9/2001 Perl
7,791,355 B1* 9/2010 Esher ............... G01R 29/0871
324/637
(Continued)

FOREIGN PATENT DOCUMENTS

EP 0911906 3/2006

OTHER PUBLICATIONS

PCT Appln. No. PCT/US2017/33164, International Search Report dated Sep. 29 2017, 10 pages.
(Continued)

*Primary Examiner* — Tan H Trinh
(74) *Attorney, Agent, or Firm* — Womble Bond Dickinson (US) LLP

(57) ABSTRACT

A method and apparatus for testing radio-frequency antenna elements are disclosed. In one embodiment, the apparatus comprises: a frame having a platform to support an array of radio-frequency (RF) antenna elements of a flat panel antenna having antenna elements; a first antenna to transmit microwave energy to subsets of RF antenna elements of the segment and to receive reflected microwave energy from the subsets of RF antenna elements; a filter between the segment and the first antenna, the filter comprising an opening positioned over each of the subsets of RF antenna elements at different times to expose said each of the subsets of RF antenna elements to microwave energy transmitted by the first antenna; a second antenna to receive microwave energy transmitted though the subsets of RF antenna elements at the different times; a controller coupled to the subsets of RF antenna elements and to provide at least one stimulus or condition to the subsets of RF antenna elements; and an analyzer to provide stimulus to the subsets of RF antenna elements and to measure a characteristic of the array using one or both of the first antenna and second antenna.

10 Claims, 21 Drawing Sheets

(51) Int. Cl.
*H04B 17/12* (2015.01)
*H04B 17/21* (2015.01)
*G01R 29/10* (2006.01)

(52) U.S. Cl.
CPC ............. *H04B 17/12* (2015.01); *H04B 17/17* (2015.01); *H04B 17/21* (2015.01)

(58) Field of Classification Search
USPC ........... 455/67.11, 67.16, 66.1, 550.1, 562.1, 455/277.1; 324/637; 342/22, 318, 361; 438/31
See application file for complete search history.

(56) References Cited

U.S. PATENT DOCUMENTS

| | | | |
|---|---|---|---|
| 8,417,114 | B1 | 4/2013 | Storey et al. |
| 9,705,611 | B1 * | 7/2017 | West ..................... H04B 17/12 |
| 2002/0065633 | A1 | 5/2002 | Levin |
| 2003/0125002 | A1 * | 7/2003 | Harrison .............. H04B 7/0615 455/277.1 |
| 2005/0272179 | A1 * | 12/2005 | Frauenglass ........ B81C 1/00492 438/31 |
| 2006/0214832 | A1 * | 9/2006 | Lee ......................... G01S 13/89 342/22 |
| 2008/0150799 | A1 * | 6/2008 | Hemmi ................ H01Q 13/085 342/361 |
| 2009/0066344 | A1 | 3/2009 | Bray et al. |
| 2010/0253350 | A1 * | 10/2010 | Huish .............. G01R 33/34007 324/318 |
| 2011/0115666 | A1 | 5/2011 | Feigin |
| 2012/0032849 | A1 * | 2/2012 | Hull, Jr. ................... H01Q 1/02 342/374 |
| 2014/0009347 | A1 * | 1/2014 | Bertin ................. H01Q 1/2258 343/725 |
| 2015/0236414 | A1 | 8/2015 | Rosen et al. |
| 2016/0233588 | A1 * | 8/2016 | Bily ....................... H01Q 21/28 |
| 2017/0338569 | A1 * | 11/2017 | Hower ................... H01Q 1/288 |
| 2019/0131934 | A1 * | 5/2019 | Khalil .................. H04B 1/0475 |
| 2019/0199414 | A1 * | 6/2019 | Hogberg ............. H04B 7/0408 |

OTHER PUBLICATIONS

International Preliminary Report and Written Opinion, dated Nov. 29, 2018, (7 pages).

* cited by examiner

Iris L2

Iris L1

Patch and Iris L1

Top View

LOCALIZED FREE SPACE TESTER

PRIORITY

This application claims priority and incorporates by reference the corresponding to U.S. Provisional Patent Application No. 62/618,487, entitled "LOCALIZED FREE SPACE SEGMENT TEST," filed on Jan. 17, 2018.

RELATED APPLICATIONS

This application is related to co-pending applications, entitled "ANTENNA ELEMENT PLACEMENT FOR A CYLINDRICAL FEED ANTENNA," filed on Mar. 3, 2016, U.S. patent application Ser. No. 15/059,837; "APERTURE SEGMENTATION OF A CYLINDRICAL FEED ANTENNA," filed on Mar. 3, 2016, U.S. patent application Ser. No. 15/059,843; "A DISTRIBUTED DIRECT ARRANGEMENT FOR DRIVING CELLS," filed on Dec. 9, 2016, U.S. patent application Ser. No. 15/374,709; "FREE SPACE SEGMENT TESTER (FSST)", filed on May 15, 2017, U.S. patent application Ser. No. 15/596,370, assigned to the corporate assignee of the present invention.

FIELD

Embodiments of the invention are in the field of communications including satellite communications and antennas. More particularly, embodiments of the invention relate to a free space tester for flat panel antennas that tests localized areas of an array of radio-frequency (RF) antenna elements.

BACKGROUND

Satellite communications involve transmission of microwaves. Such microwaves can have small wavelengths and be transmitted at high frequencies in the gigahertz (GHz) range. Antennas can produce focused beams of high-frequency microwaves that allow for point-to-point communications having broad bandwidth and high transmission rates. A measurement that can be used to determine if an antenna is properly functioning is a microwave frequency response. This is a quantitative measure of the output spectrum of the antenna in response to a stimulus or signal. It can provide a measure of the magnitude and phase of the output of the antenna as a function of frequency in comparison to the input stimulus or signal. Determining the microwave frequency response for an antenna is a useful performance measure for the antenna.

Some antenna apertures are constructed using radio-frequency (RF) antenna segments. These apertures have thousands of RF antenna elements that form an array. Each of the antenna elements is addressed individually to generate a desired RF wave. Testing such antenna elements to identify RF antenna elements operating incorrectly is difficult when the measured response is an average response of all the RF elements in a segment unless many elements (e.g., 2-4%, 100-200 elements, etc.) are deficient.

SUMMARY

A method and apparatus for testing radio-frequency antenna elements are disclosed. In one embodiment, the apparatus comprises: a frame having a platform to support an array of radio-frequency (RF) antenna elements of a flat panel antenna having antenna elements; a first antenna to transmit microwave energy to subsets of RF antenna elements of the segment and to receive reflected microwave energy from the subsets of RF antenna elements; a filter between the segment and the first antenna, the filter comprising an opening positioned over each of the subsets of RF antenna elements at different times to expose said each of the subsets of RF antenna elements to microwave energy transmitted by the first antenna; a second antenna to receive microwave energy transmitted though the subsets of RF antenna elements at the different times; a controller coupled to the subsets of RF antenna elements and to provide at least one stimulus or condition to the subsets of RF antenna elements; and an analyzer to provide stimulus to the subsets of RF antenna elements and to measure a characteristic of the array using one or both of the first antenna and second antenna.

BRIEF DESCRIPTION OF THE DRAWINGS

The present invention will be understood more fully from the detailed description given below and from the accompanying drawings of various examples and examples which, however, should not be taken to the limit the invention to the specific examples and examples, but are for explanation and understanding only.

DETAILED DESCRIPTION

Figure 1A:
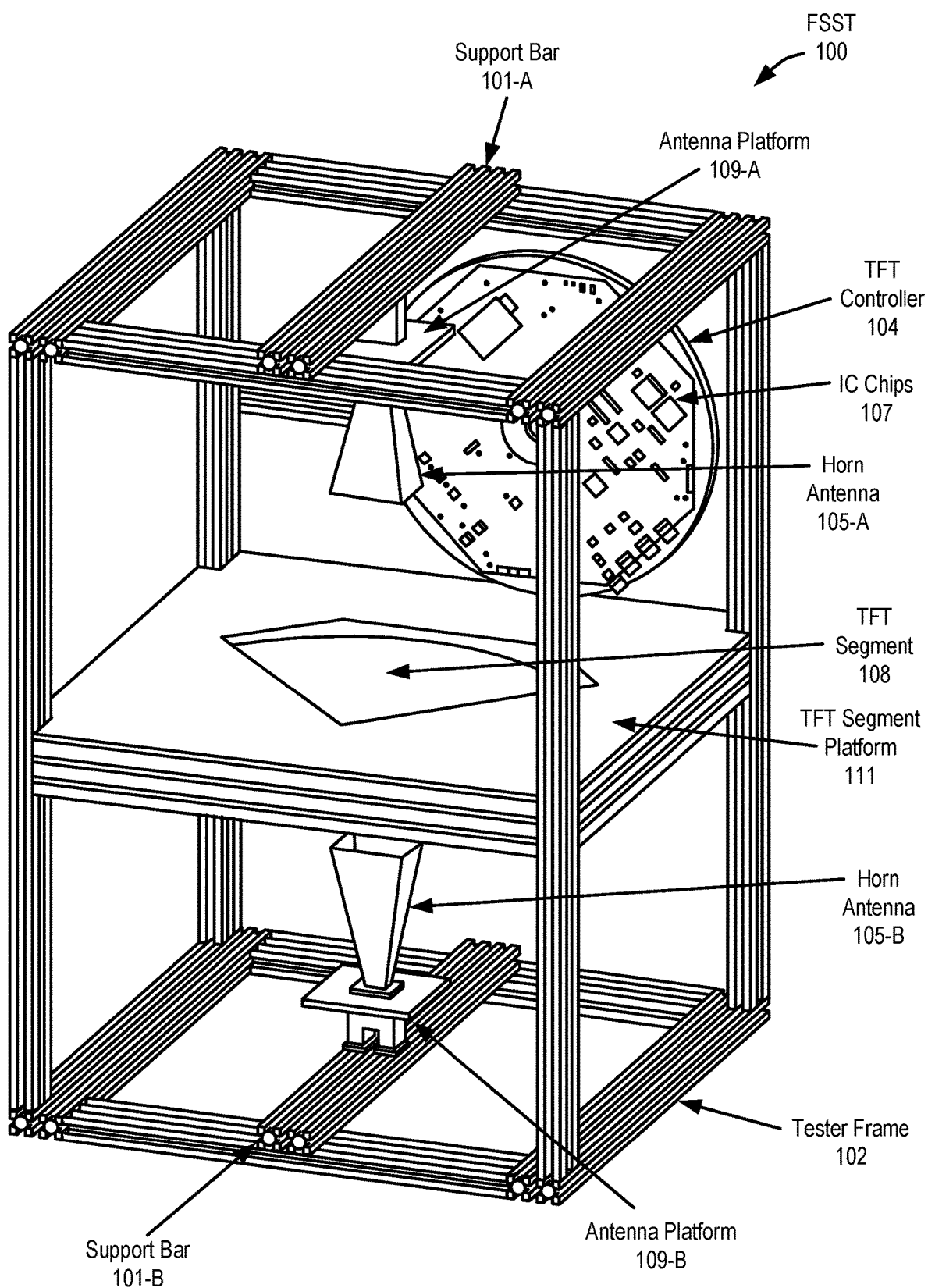
FIG. 1A illustrates an exemplary free space tester.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Methods and apparatuses are disclosed for a free space tester for testing radio-frequency (RF) radiating antenna elements, such as, for example, those discussed in more detail below. In one example, an apparatus includes a frame, a first antenna (e.g., a horn or other directional antenna), a filter, a second antenna (e.g., a horn or other directional antenna), a controller, and an analyzer. The frame has a platform to support an array of RF radiating antenna elements of a flat panel antenna. In one embodiment, the array of RF radiating antenna elements comprises all of the antenna elements of the antenna aperture. In another embodiment, the array of RF radiating antenna elements are those on one segment of antenna aperture formed by combining multiple (e.g., 2, 3, 4, etc.) segments of RF radiating antenna elements. In one embodiment, the segment comprises a thin film transistor (TFT) segment that contains antenna elements with TFTs used to control the antenna elements.

In one embodiment, of the tester, the first directional/horn antenna transmits microwave energy through a hole in the filter to a portion of the array of antenna elements under test (e.g., an aperture containing a plurality of antenna elements, a segment containing only a subset of antenna elements of an aperture, etc.) and receives reflected microwave energy from that portion of the array. The second directional/horn antenna receives microwave energy transmitted through the portion of the array. The controller is coupled to the array and provides at least one stimulus or condition to the array. The analyzer provides a stimulus to the array of antenna elements being tested and measures a characteristic for the array using one or both of the first directional/horn antenna and the second directional/horn antenna.

Examples of the measured characteristic include a microwave reflected frequency response characteristic at the first directional/horn antenna for the portion of the antenna array exposed to the directional/horn via the hole in the filter. In other examples, a second directional/horn antenna can be used to receive microwave energy from the antenna array. A measured characteristic can include a microwave frequency response at the second directional/horn antenna for the portion of the antenna array exposed by the hole in the filter. The measured microwave frequency response at the first directional/horn antenna or second directional/horn antenna can be a function of a command signal stimulus or without a command signal stimulus from the controller. The measured microwave frequency response can also be a function of an environmental condition. Other examples of measured characteristics for the antenna array include a measured transmission response at the second directional/horn antenna and a measured reflection response at the first directional/horn antenna for the antenna array. In some examples, the measured characteristic is only the measured transmission response at the second directional/horn antenna. In some examples, the measured characteristic is only the measured reflection response.

In one example, a computer is coupled to the controller and analyzer and can tune the RF radiating elements to have a more desirable microwave frequency response (e.g., transmission response, reflection response) characteristics of the antenna array being tested based on one or more stimuli. In one embodiment, this tuning is performed by applying voltage offsets to have a more desirable response for beamforming. In one embodiment, the tuning is a correction that sets a voltage to make sure the antenna elements provide a particular or proper resonant frequency. In one embodiment, the tuning of one or more RF antenna elements is to correct for environmentally induced frequency shifts (e.g., frequency shifts caused by temperature). This is particular important when a liquid crystal (LC) reservoir is used for the LC in the RF radiating antenna elements to help maintain the gap spacing in the antenna elements that changes due to temperature. The computer can also characterize the microwave frequency response (e.g., transmission response, reflection response) for the antenna array. In one example, the antenna array is used or integrated into a flat panel antenna if the measured characteristic of the antenna array indicates the antenna array is acceptable.

Some portions of the detailed description that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Free Space Tester (FST)

FIG. 1A illustrates an exemplary free space tester (FST) 100. In this example, FST 100 is a microwave measurement device capable of evaluating and calibrating responses for flat panel antenna components under test, e.g., thin-film-transistor (TFT) segment 108 that contains antenna elements. Note that FST 100 is described below in terms of a TFT segment 108; however, one skilled in the art would recognize that the testing techniques described herein are not limited to testing RF radiating antenna elements on segments that are combined to form an antenna aperture and may be used with arrays of antenna elements of a non-segmented aperture. Examples of flat panel components can be for flat panel antennas as described in FIGS. 3-19B and in co-pending related applications U.S. patent application Ser. Nos. 15/059,837; 15/059,843; and 15/374,709. In one example, FST 100 is compatible with automated and fast measurement techniques and can have a small footprint in a production line for assembling flat panel antennas made from an array of TFT segments each containing antenna elements that are tested.

In the following examples, FST 100 enables in-process inspection and testing of characteristics of stand-alone flat panel antenna components. For example, a microwave frequency response can be measured for TFT segment 108 prior to integration into a completely assembled flat panel antenna. In this way, by using FST 100, defective flat panel antennas can be reduced by identifying defective components, e.g., TFT segments, and replacing them before final assembly into a flat panel antenna, which can also reduce assembly costs. In other words, an array of RF antenna elements that is determined to be defective as a result of testing can be rejected so that those antenna elements are not included in the antenna (i.e., in-line rejection). Measurements and testing using FST 100 can be seamlessly integrated into the flat panel antenna assembly process. The measurements from FST 100 can also be used for design, development, and tuning purposes for a flat panel antenna. FST 100 also provides a non-destructive process of determining microwave functionality of flat panel antennas by performing testing and measurements on sub-components such as TFT segment 108.

FST 100 includes a tester frame 102 providing a physical structure holding TFT segment platform 111 supporting TFT segment 108. In this example, tester frame 102 includes an anti-static shelf such as TFT segment platform 111 having a segment shaped cutout to support TFT segment 108. The shaped cutout and TFT segment 108 can have any type of shape that form part of a flat panel antenna. Tester frame 102 also supports two horn antennas 105-A and 105-B located above and below TFT segment 108 with respective antenna platforms 109-A and 109-B connected to respective support bars 101-A and 101-B. In other examples, the positions of support bars 101-A and 101-B and antenna platforms 109-A and 109-B can be adjusted. Note that while FIGS. 1A-1C illustrate horn antennas, other types of directional antennas or non-directional antennas may be used.

Figure 1B:
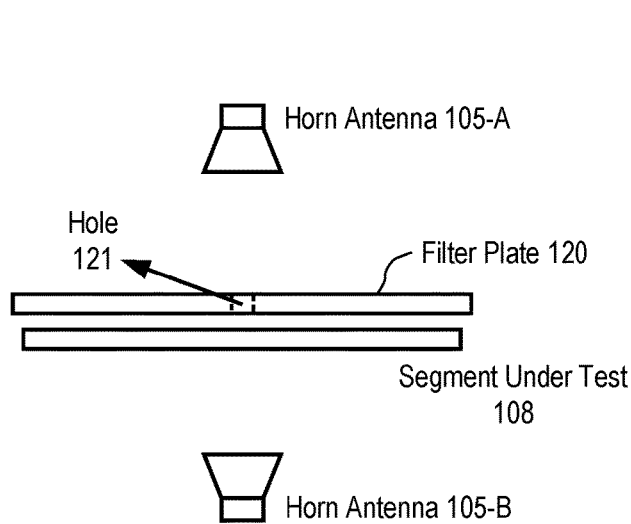
FIG. 1B illustrates one embodiment of a tester with a filter.
Figure 1C:
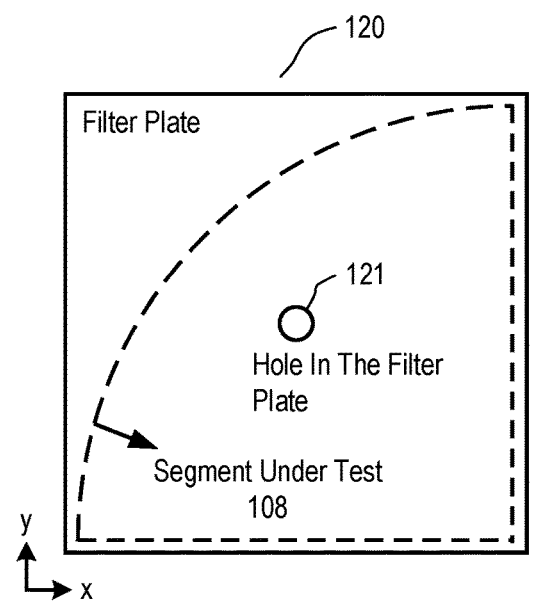
FIG. 1C illustrates one embodiment of a filter plate.

Although not shown in FIG. 1A, in one embodiment, FST 100 includes a filter, such as shown in FIGS. 1B and 1C. Referring to FIGS. 1B and 1C, in one embodiment, the filter plate 120 is positioned between horn antenna 105-A and TFT segment 108 and includes a hole or other opening 121. Note that this is not required for a transmission measurement. In another embodiment, filter plate 120 is positioned between horn antenna 105-B and TFT segment 108. In one embodiment, hole 121 has a circular edge. However, hole 121 need not be circular or have rounded edges and may have any shape which isolates the area of interest from the rest of the segment (e.g., a rectangular shape, a ring (e.g., a ring that follows the pitch/location of routing lines as to look at one row or column at a time)). In one embodiment, the size of the opening is adjustable to be more open or closed.

In one embodiment, filter plate 120 comprises a metal plate (e.g., an aluminum) with a hole 121. Alternatively, any conductive material may be used. For example, an electromagnetic shield material or RF absorber (e.g., carbon coated fiber mesh) can be used to build the filter plate. In yet another embodiment, filter plate 120 comprises metalized plastic or some material with an adjustable iris.

In one embodiment, hole 121 is in the center of filter plate 120; however, other locations within filter plate 120 may be used as long as they are aligned with horn antennas 105-A and 105-B. Furthermore, in alternative embodiments, the testing can still be performed if the opening in the filter isn't centered to the horn antenna but is within a viewing area when signal strength is large enough. In one embodiment, filter plate 120 is placed on TFT segment 108 during an FST measurement (See FIG. 1B) and acts as a filter limiting the RF response to a smaller area of interest by preventing the RF signal from exiting the TFT segment 108 over areas covered with material (e.g., metal) of filter plate 120. In other words, the RF response measured in FST using this method is generated by the RF elements overlapping with hole 121. Thus, the use of filter plate 120 described herein aims to decrease the number of antenna elements over which an RF response is averaged and enable an FST measurement over a single RF element.

In one embodiment, the size of hole 121 is as small as an RF element size and that enables "element-by-element" testing. In one embodiment, the size of hole 121 is about ½ inch or is the size of 7-8 antenna elements. Other sized holes may be used.

In one embodiment, filter plate 120 is used in conjunction with particular driving techniques during segment testing. In one embodiment, the driving techniques involves driving RF elements of the segment residing in a smaller area of interest to a resonance frequency (F1) while keeping all other elements at a frequency as far away from F1 as possible. In one embodiment, those will be the frequencies at two ends of the RF element tuning range.

The use of filter plate 120 and/or particular driving techniques allows for detecting defects present in a small number of RF antenna elements on a TFT segment, such as, for example, variation in cell gap or misconnections (line-outs, which is an electrical short between electrical traces or a disconnection in an electrical trace causing improper operation of RF antenna elements along those traces) in TFT array locally in the TFT segment. Other regional defects could be bad TFTs that fail to charge or that leak excessively. In one embodiment, the techniques set forth herein include an element-by-element testing method for the liquid crystal-based antenna element. These antenna elements may be part of a TFT segment. Examples of such an antenna segment and antenna aperture containing the segments are described herein. Element-by-element testing capability enables identifying defects during manufacturing at an early stage. This is critical for increasing yield in a mass production environment. In one embodiment, the testing techniques also permit tuning for local cell gap variations within a single segment.

FST 100 includes a TFT controller 104. In one example, TFT controller 104 is circuit board with an electronic assembly used in a flat panel antenna system having IC chips 107 connected to tester frame 102. Although not shown, a computing system, personal computer (PC), server, or data storage system can be coupled to TFT controller 104 to control TFT controller 104 or store data for TFT controller 104. For example, as shown in FIG. 1D, a computer 110 can be coupled to TFT controller 104 and an analyzer 103 coupled to horn antennas 105-A and 105-B to measure responses for the portion of TFT segment 108 being tested.

IC chips 107 for TFT controller 104 can include microcontrollers, processors, memory to store software and data, and other electronic subcomponents and connections. In one example, TFT controller 104 runs software that generates command signals sent to TFT segment 108 that can charge or apply voltage to transistors or cells (to turn them on) in TFT segment 108 in measuring a response, e.g., a microwave frequency response. In other examples, no transistors or cells in TFT segment 108 are turned in measuring a response, or a pattern of transistors or cells can be turned on to measure a response for TFT segment 108.

Figure 1D:
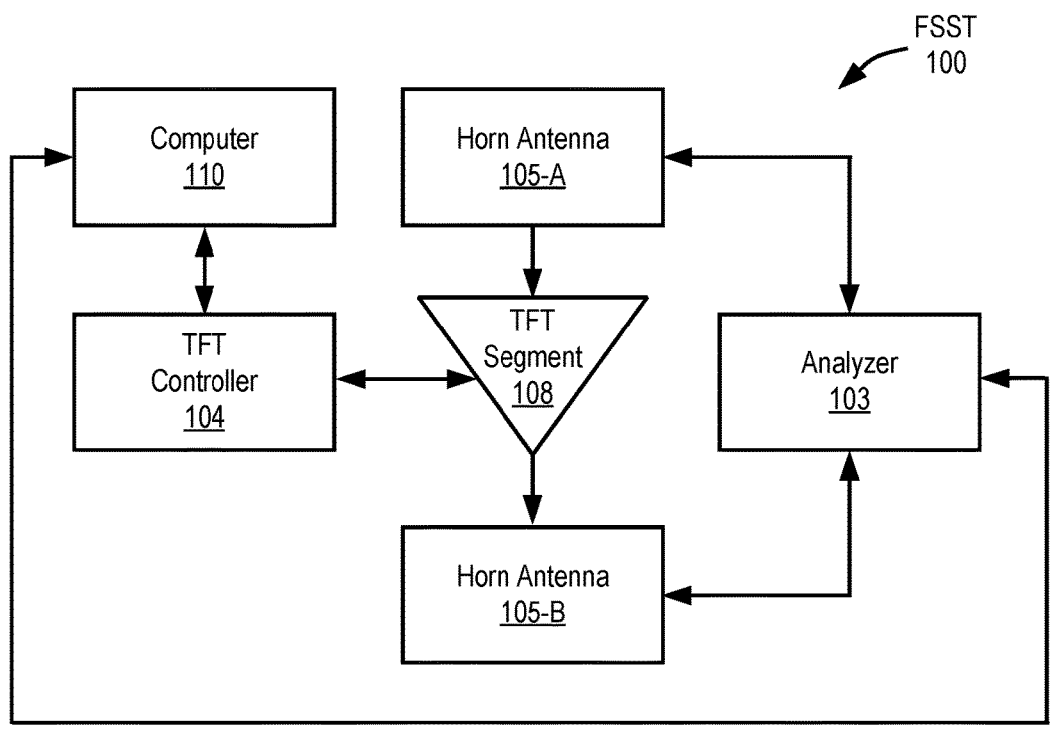
FIG. 1D illustrates an exemplary block diagram of components of the tester of FIGS. 1A and 1B.

In other examples, TFT controller 104 can be part of TFT platform 111 and connected to a standalone PC or server, e.g., computer 110 in FIG. 1D. TFT controller 104 or an attached computer 110 or server can be coupled and control horn antennas 105-A and 105-B and TFT segment 108 (or other electronic components for FST 100) and to send and receive signals to and from these components. Tester frame 102 can provide RF and electrical cabling and interconnections coupling the TFT controller 104 with horn antennas 105-A and 105-B, TFT segment 108, and any other computing device or server.

In some examples, horn antennas 105-A and 105-B above and below TFT segment 108 can project microwave energy or transmit microwave signals to a portion of TFT segment 108 exposed by hole 121 of filter place 120 and collect or receive microwave energy or signals transmitted through the portion of TFT segment 108 that is beneath hole 121 of filter plate 120. For example, horn antenna 105-A can be placed over a desired location of TFT segment 108 exposed by hole 121 and transmit microwave signals to that portion of TFT segment 108 to the desired location and those signals can be received by horn antenna 105-B under the portion of TFT segment 108 beneath hole 121. The horn antennas 105-A and 105-B can be placed in stable locations to project microwave energy or signals directly to the TFT segment 108 with minimal residual microwave energy being directed away from TFT segment 108. In one example, referring to FIGS. 1A, 1B and 1D, horn antennas 105-A and 105-B can be coupled to any type of microwave measurement analyzer, e.g., analyzer 103, and provide measurements to a connected computer, e.g., computer 110.

The microwave energy or signals received by either horn antennas 105-A or 105-B can be measured and tested, e.g., by an analyzer 103 in FIG. 1D. Such measurement and testing allows for non-destructive and non-contact means of determining microwave functionality of TFT segment 108, which can form part of a TFT array for a flat panel antenna. In these examples, the performance of TFT segment 108 can be assessed that is continuous with the production process of assembling arrays of TFT segments for production of a flat panel antenna. In this way, defective TFT segments can be replaced with non-defective TFT segments prior to final assembly of the flat panel antenna.

In one example, referring to FIGS. 1A, 1B and 1D, computer 110, coupled to TFT controller 104, can perform a number of tests and measurements of characteristics for TFT segment 108 using horn antennas 105-A and 105-B and analyzer 103. In one example, analyzer 103 measures reflection or transmission coefficients of TFT segment 108. In other examples, analyzer 103 measures a microwave frequency response in an active state (e.g., as a function of a command signal) or a passive state (e.g., without the use of a command signal). The measured response can be a transmission or reflected responses for testing TFT segment 108 using horn antennas 105-A and 105-B. In one embodiment, the transmission vs. frequency curve is generated based on the measurements and compared to a desired curve. In one embodiment, tuning of one or more RF elements being tested is performed based on the results of the comparison.

In some examples, the measured responses by analyzer 103 on TFT segment 108 can be used to provide statistical process control information for TFT segment 108 such as, e.g., Cp (target value offset), Cpm (normal distribution curve), and Cpk (six sigma processing data). In one example, such information can be used to determine if the portions of TFT segment 108 being tested is acceptable for use in assembly of a flat panel antenna. In one example, computer 110 can quantify the responses using stimuli such as electrical command signals, environmental conditions, or other types of stimuli. The responses measured by analyzer 103 can also be used to characterize responses from the TFT segment 108 and stored for later processing.

FST Operation

FIG. 1D illustrates an exemplary block diagram of components of the FST 100 of FIGS. 1A and 1B. In this example, computer 110 is coupled to TFT controller 104 and analyzer 103. TFT controller 104 is coupled to TFT segment 108 and analyzer 103 is coupled to horn antennas 105-A and 105-B and computer 110. Horn antennas 105-A and 105-B can provide and receive microwave energy or signals that are measured by analyzer 103. In one example, horn antenna 105-A projects microwave energy or signals to a portion of TFT segment 108 exposed by hole 121, which passes through TFT segment 108, is received by horn antenna 105-B and is measured by analyzer 103. In another example, horn antenna 105-A projects microwave energy or signals to a portion of TFT segment 108 exposed by hole 121, which is reflected by TFT segment 108 back to horn antenna 105-A and measured by analyzer 103. In one embodiment, analyzer 103 provides an RF stimulus to the RF antenna elements and measures how the RF elements modify the stimulus. In one embodiment, analyzer 103 measures complex characteristics of the microwave energy or signals such as phase and amplitude transmission and reflection coefficients for the TFT segment 108. In one example, transmission and reflection coefficients are measured as a function of microwave frequency and/or a command signal provided by TFT controller 104.

In one example, analyzer 103 provides a swept microwave signal or energy to horn antenna 105-A by way of a radio frequency (RF) cable that projects the microwave signal or energy to a portion of TFT segment 108 exposed by hole 121. A portion of the microwave energy can be transmitted through TFT segment 108 and received by horn antenna 105-B. A portion of the microwave energy can also be reflected by a portion of TFT segment 108 exposed by hole 121 and received by horn antenna 105-A. In this example, analyzer 103 determines the portion of the projected microwave energy transmitted through TFT segment 108 and received by horn antenna 105-B and reflected off the surface of the TFT segment 108 and received by horn antenna 105-A. In other examples, analyzer 103 can calculate transmission and reflection values or data (e.g., complex phase and amplitude coefficients). Analyzer 103 can store or display these values or transmit the values to computer 110. Thus, in one embodiment, analyzer 103 sweeps the frequency and then measures the response.

In one example, computer 110 controls TFT controller 104 to provide a command signal to TFT segment 108 to control voltage for the transistors of TFT segment 108 to generate the maximum voltage differential on RF antenna element and analyzer 103 measures microwave energy transmitted or reflected by horn antennas 105-A and 105-B referred to as an "on" response. In other examples, a command signal is provided by the TFT controller 104 to generate a minimum (e.g., typically zero) voltage differential on RF antenna element and analyzer 103 measures microwave energy transmitted or reflected by horn antennas 105-A and 105-B referred to as "off" response. The off response may be desired when a physical connection to TFT segment 108 is not available and this is referred to as "disconnected" response. In one example, TFT controller 104 can implement software or algorithms to vary command signals while measuring the corresponding microwave energy response for TFT segment 108. In this way, the measured response can be tuned based on the varying of the command signals and the bias applied to each element or transistor of TFT segment 108 versus the measured response can be obtained. More specifically, in one embodiment, the measured response as a function of bias can be used to generate corrected biases that generate the desired responses. In such a way, the frequency shift can be obtained as a function of the applied voltage. In one example, analyzer 103 can measure switching time required to switch between two states for TFT segment 108.

In some examples, FST 100 of FIGS. 1A, 1B and 1D is located in a manufacturing line for flat panel antennas and provide continuous and in process quality measurements (e.g., measured frequency response) to detect performance variations in TFT segment 108 such as, e.g., varying environmental exposures. In other examples, one horn antenna 105-A is used to measure reflected microwave energy or signals from TFT segment 108. Inspection and testing using FST 100 can be a final inspection for TFT segment 108 to determine if it is defective and replaced prior to assembly of a final flat panel antenna.

Figure 1E:
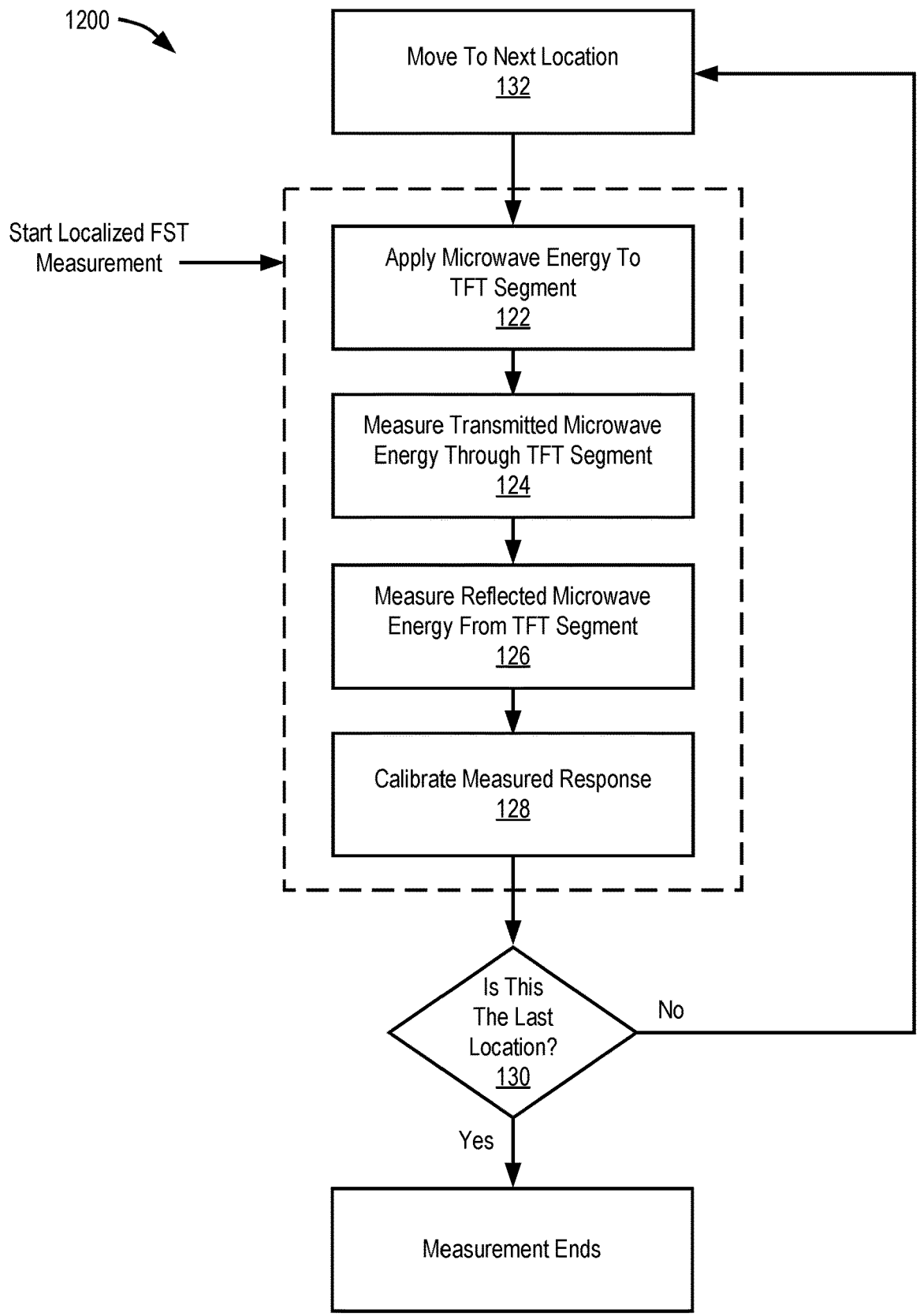
FIG. 1E illustrates an exemplary operation for operating the tester of FIGS. 1A-1D.

FIG. 1E illustrates an exemplary operation 120 for operating the FST 100 of FIGS. 1A and 1B. At operation 122, microwave energy is applied to a portion of TFT segment 108 exposed by hole 121 (e.g., horn antenna 105-A can project microwave energy to a portion of TFT segment 108 exposed by hole 121). At operation 124, the microwave energy transmitted through a TFT segment is measured (e.g., the transmitted microwave energy from horn antenna 105-A through TFT segment 108 is measured at horn antenna 105-B by analyzer 103). At operation 126, microwave energy reflected from a portion of TFT segment 108 exposed by hole 121 is measured e.g., the projected microwave energy from horn antenna 105-A reflected back from TFT segment 108 is measured at horn antenna 105-A by analyzer 103). At operation 128, in one embodiment, the measured response is used by TFT controller 104 to adjust a stimulus (command signal or external) to tune one or more of the antenna elements so that they provide the expected response when voltages are applied to the antenna elements.

Next, at operation 130, a test is performed to determine if the location being tested is the last operation. If it is, then the measurement ends; if not, at operation 132, the TFT segment 108 is moved relative to filter plate 120 and horn antennas 105-A and 105-B to expose another portion of TFT segment 108 for testing. Then operations 1200 are repeated. This continues until a predetermined amount of TFT segment 108 undergoes testing. This could be all of TFT segment 108, a substantial portion of TFT segment 108 or a predetermined portion of TFT segment 108 that is less than a substantial portion.

To perform an element-by-element testing (or region-by region testing) of TFT segment 108, segment 108 is moved in x and y directions with respect to the hole on filter plate 120 and horn antennas 105-A and 105-B. In one embodiment, the movement is approximately equal to the pitch between RF elements in the array, and a different RF antenna element is aligned with the hole at each step. In an alternative embodiment, the same principle can also be applied by keeping the segment stationary and moving filter plate 120 and horn antennas 105-A and 105-B. In this case, filter plate 120 and horn antennas 105-A and 105-B move together with the same amount of displacement in the same direction. In one embodiment, the movement of segment 108 or filter plate 120 and horn antennas 105-A and 105-B is accomplished with a mechanical mechanism. In one embodiment, this mechanism includes a motorized x-y stage that can move in x and y directions with steps less than an element size and a controller, which may be computer 110, to automate move-measure-move routine.

Figure 20:
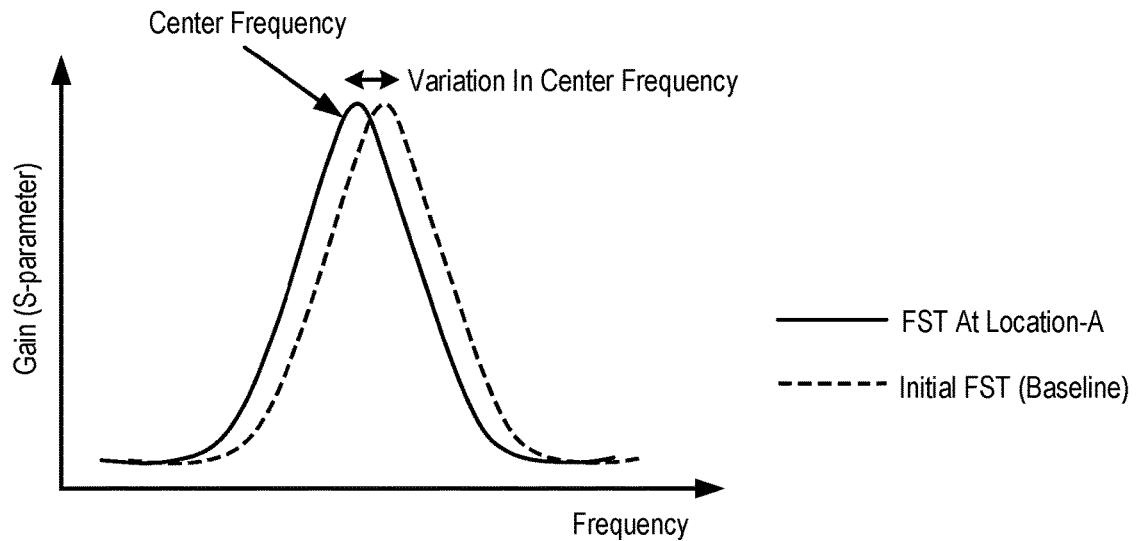
FIG. 20 illustrates a frequency response in the FSST and its variation from baseline.

In one embodiment, the center frequency (or peak frequency) measured in FST is monitored to detect any defects in the localized FST region. An initial FST measurement, where all RF elements are driven to the same state, is performed before starting localized measurements to establish a baseline center frequency. One can observe the change in the measured center frequency as measurements are performed over different locations on the RF antenna segment. FIG. 20 illustrates the frequency response in FST and its variation from baseline result to a location (Location-A) with different cell gap or charging state. Referring to FIG. 20, the change in center frequency is caused by a variation in the cell gap of the RF element or a variation of charging state or leakage.

Figure 2A:
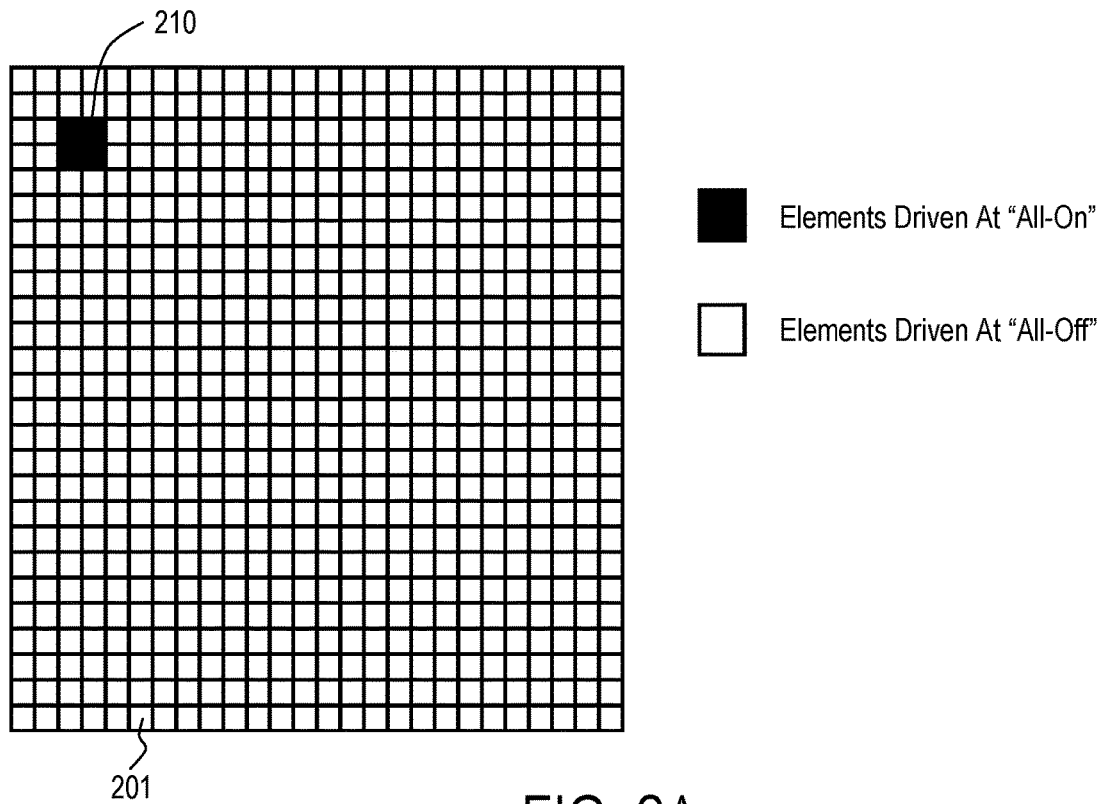
FIG. 2A illustrates isolated elements of an array of antenna elements.
Figure 21:
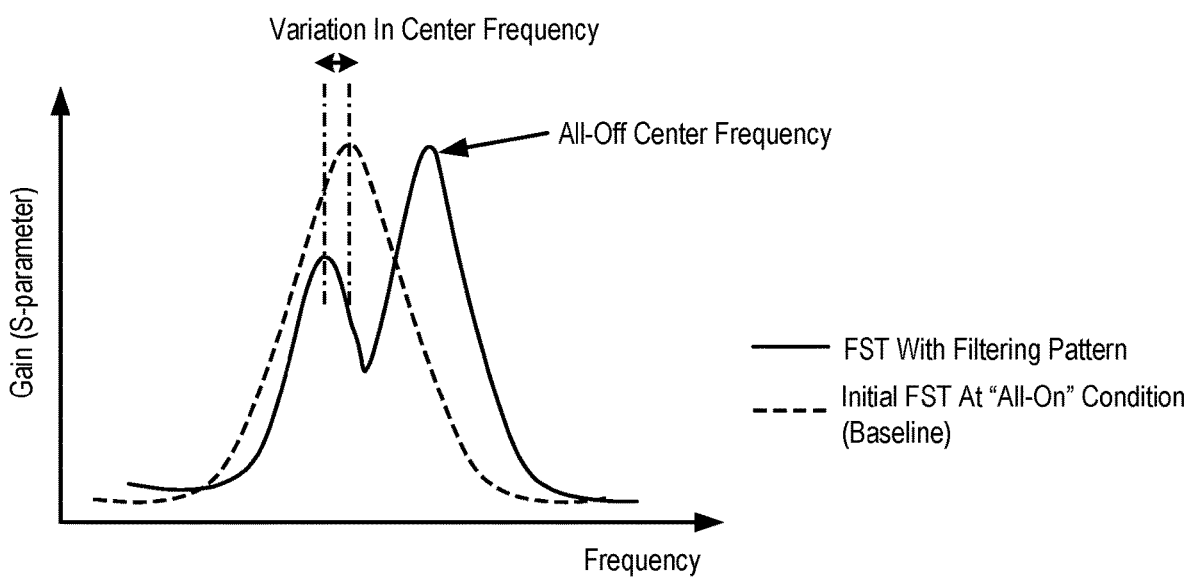
FIG. 21 illustrates a FSST measurement with a region of interest driven to an all-on state while the remainder of the array is driven to an all-off state.

In another method for testing segment 108, a similar filtration can be applied electrically. For example, in this testing method, a region of interest (e.g., a set of RF antenna elements) can be driven to a center frequency, for example an "All-On" frequency, while the rest of the RF elements are driven to a center frequency as far away as possible, for example "All-Off" frequency. FIG. 2A illustrates an example of four elements in the array being isolated from the array by driving them at a different voltage condition. Referring to FIG. 2A, both "All-off" and "All-on" frequencies in the FST are measured with the horn antenna aligned to the region of interest (ROI). The "All-on" response is generated by only the ROI while "All-off" response is generated by rest of the RF elements. FIG. 21 illustrates a FST measurement with a region of interest driven at "All-on" while the array is at "All-off". Again, the variation of center frequency can be observed by comparing "All-on" center frequency from ROI to the baseline "All-on" center frequency. Then, this variation in center frequency can be used to detect a variation in the cell gap of the RF element, a variation in charging state, or line-outs. Due to the presence of a second center frequency created by the rest of RF elements, it may not be possible to perform an element-by-element testing in this method. In one embodiment, a minimum number of RF elements required to generate a measurable signal determines the resolution of the method. In one embodiment, a map of center frequency over the RF antenna segment is created by moving the ROI and the horn antenna at the same time and performing FST at each location.

Figure 2B:
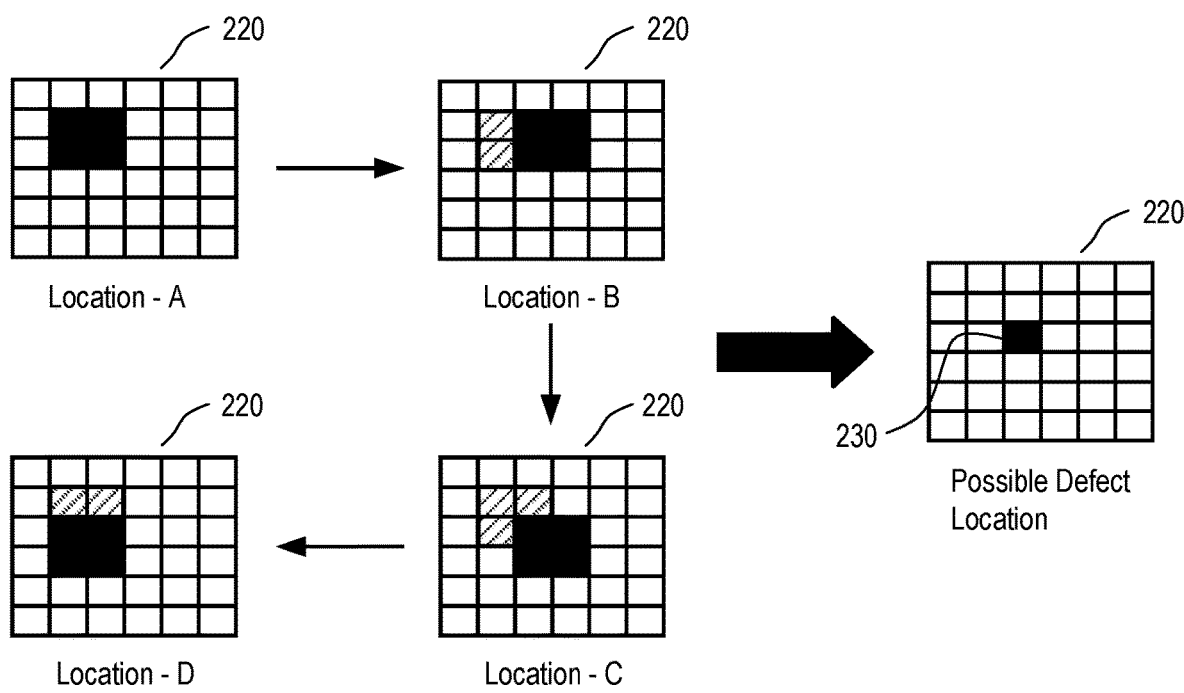
FIG. 2B illustrates one embodiment of a process to perform element-by-element testing.

When detecting an FST response from a single RF element isn't possible, a larger group of elements are used to scan the array. FIG. 2B illustrates one embodiment of a process for element-by-element testing using the additional testing method. Referring to FIG. 2B, black squares in region 220 are driven to "All-on" during testing and gray squares show the region where a deviation from "All-on" baseline center frequency is first detected. A variation in center frequency is detected first at Location-A. Then an area neighboring Location-A is scanned with steps of a single RF element in an x or y direction, such as, for example from Location-B to Location-D. If a similar variation is observed at each of those locations, the tester, or computer 110, determines that the observed variation is due to the RF element at the overlap of those 4 regions. To confirm the conclusion, in one embodiment, the tester performs a second scan around the possible defect location. During the second scan, a possible defect location is kept in "All-off" state while elements around that location are turned into "All-on" state. If the center frequency variation is not observed, a defect location estimate is confirmed. Variations of this method such as, for example, but not limited to, turning on or turning off elements row-by-row or column-by-column to discover defect locations can be applied to detect cell gap variations, charging, state variations, and line-outs.

In one embodiment, the tester illustrated above performs one or more testing methods describe above on an antenna element aperture, or segment thereof, alone or in combination with each other, to identify deficient RF antenna segments during the manufacturing process.

Overview of Exemplary Flat Panel Antenna System

In one example, the flat panel antenna, including its segments, may undergo testing to become or as part of a metamaterial antenna system. Examples of a metamaterial antenna system for communications satellite earth stations are described. In one example, the antenna system is a component or subsystem of a satellite earth station (ES) operating on a mobile platform (e.g., aeronautical, maritime, land, etc.) that operates using frequencies for civil commercial satellite communications. In some examples, the antenna system also can be used in earth stations that are not on mobile platforms (e.g., fixed or transportable earth stations).

In one example, the antenna system uses surface scattering metamaterial technology to form and steer transmit and receive beams through separate antennas. In one example, the antenna systems are analog systems, in contrast to antenna systems that employ digital signal processing to electrically form and steer beams (such as phased array antennas).

In one example, the antenna system is comprised of three functional subsystems: (1) a wave guiding structure consisting of a cylindrical wave feed architecture; (2) an array of wave scattering metamaterial unit cells that are part of antenna elements; and (3) a control structure to command formation of an adjustable radiation field (beam) from the metamaterial scattering elements using holographic principles.

Examples of Wave Guiding Structures

In one embodiment, a coaxial feed that is used to provide a cylindrical wave feed to RF radiating antenna elements (e.g., surface scattering metamaterial elements) of an electronically steerable flat panel antenna. In one embodiment, the coaxial feed includes a center conductor and an outer conductor. In one example, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another example, a cylindrically fed antenna creates an inward travelling feed wave. In such a case, the feed wave most naturally comes from a circular structure.

Figure 3:
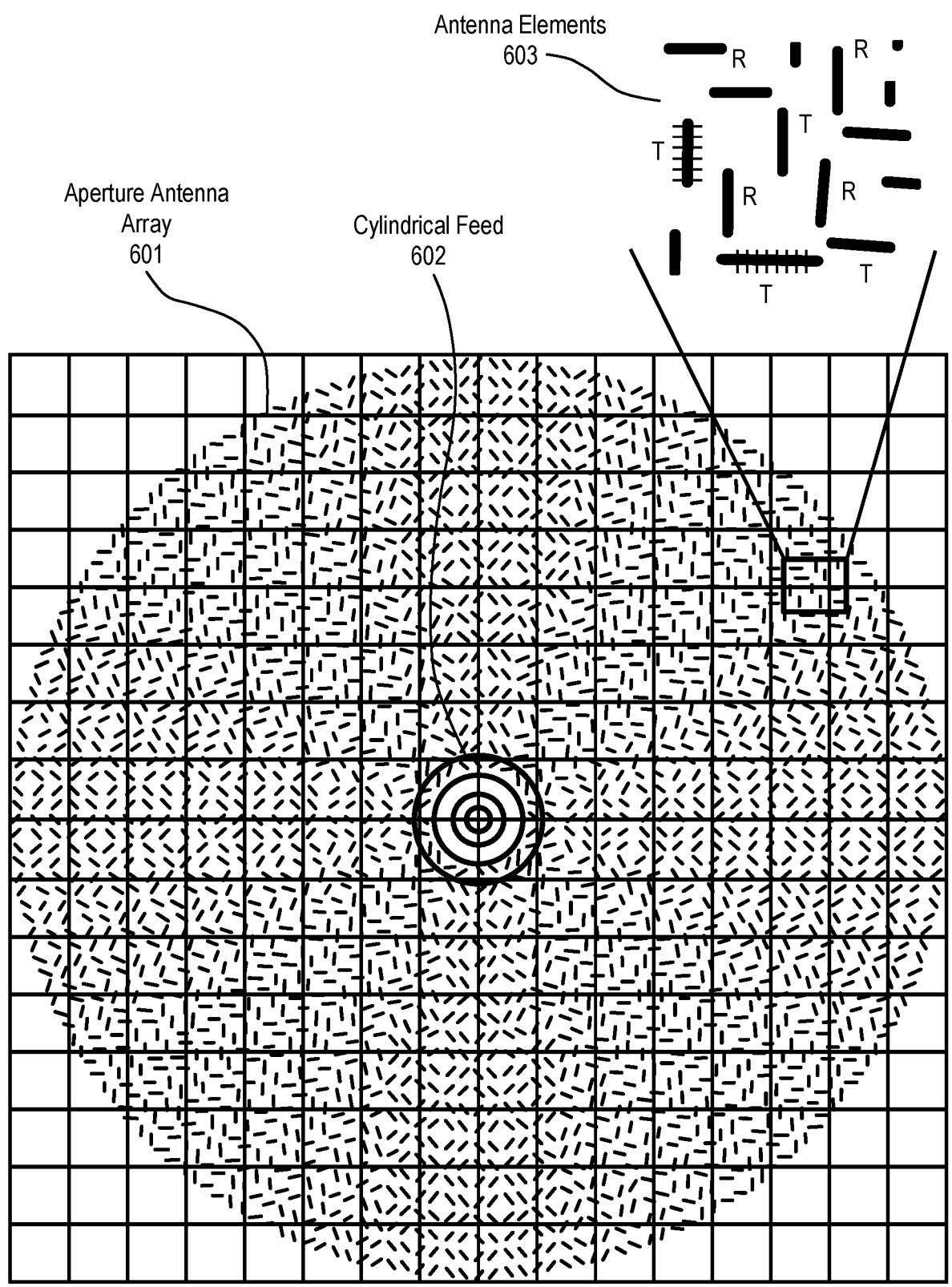
FIG. 3 illustrates an aperture having one or more arrays of antenna elements placed in concentric rings around an input feed of the cylindrically fed antenna according to one example

FIG. 3 illustrates the schematic of one embodiment of a cylindrically fed holographic radial aperture antenna. Referring to FIG. 3, the antenna aperture has one or more arrays 601 of antenna elements 603 that are placed in concentric rings around a cylindrical input feed 602 of the cylindrically fed antenna. In one embodiment, antenna elements 603 are radio frequency (RF) resonators that radiate RF energy. In one embodiment, antenna elements 603 comprise both Rx and Tx irises that are interleaved and distributed on the whole surface of the antenna aperture. Note that the RF resonators described herein may be used in antennas that do not include a cylindrical feed.

In one embodiment, the antenna includes a coaxial feed that is used to provide a cylindrical wave feed via input feed 602. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In one embodiment, antenna elements 603 comprise irises and the aperture antenna of FIG. 3 is used to generate a main beam shaped by using excitation from a cylindrical feed wave for radiating irises through tunable liquid crystal (LC) material.

Antenna Elements

In one example, the antenna elements comprise a group of patch and slot antennas (unit cells). This group of unit cells comprises an array of scattering metamaterial elements. In one example, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As would be understood by those skilled in the art, LC in the context of CELC refers to inductance-capacitance, as opposed to liquid crystal.

In one example, a liquid crystal (LC) is disposed in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one example, the liquid crystal integrates an on/off switch and intermediate states between on and off for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one example, the feed geometry of this antenna system allows the antenna elements to be positioned at forty-five degree (45°) angles to the vector of the wave in the wave feed. Note that other positions may be used (e.g., at 40° angles). This position of the elements enables control of the free space wave received by or transmitted/radiated from the elements. In one example, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one example, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides as described above.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

In one example, a matrix drive is used to apply voltage to the patches in order to drive each cell separately from all the other cells without having a separate connection for each cell (direct drive). Because of the high density of elements, the matrix drive is the most efficient way to address each cell individually.

In one example, the control structure for the antenna system has 2 main components: the controller, which includes drive electronics for the antenna system, is below the wave scattering structure, while the matrix drive switching array is interspersed throughout the radiating RF array in such a way as to not interfere with the radiation. In one example, the drive electronics for the antenna system comprise commercial off-the-shelf LCD controls used in commercial television appliances that adjust the bias voltage for each scattering element by adjusting the amplitude of an AC bias signal to that element.

In one example, the controller also contains a microprocessor executing software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the controller controls which elements are turned off and which elements are turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one example, multistate control is used in which various elements are turned on and off to varying levels, further approximating a sinusoidal control pattern, as opposed to a square wave (i.e., a sinusoid gray shade modulation pattern). In one example, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one example, the antenna system produces one steerable beam for the uplink antenna and one steerable beam for the downlink antenna. In one example, the antenna system uses metamaterial technology to receive beams and to decode signals from the satellite and to form transmit beams that are directed toward the satellite. In one example, the antenna systems are analog systems, in contrast to antenna systems that employ digital signal processing to electrically form and steer beams (such as phased array antennas). In one example, the antenna system is considered a "surface" antenna that is planar and relatively low profile, especially when compared to conventional satellite dish receivers.

Figure 4A:
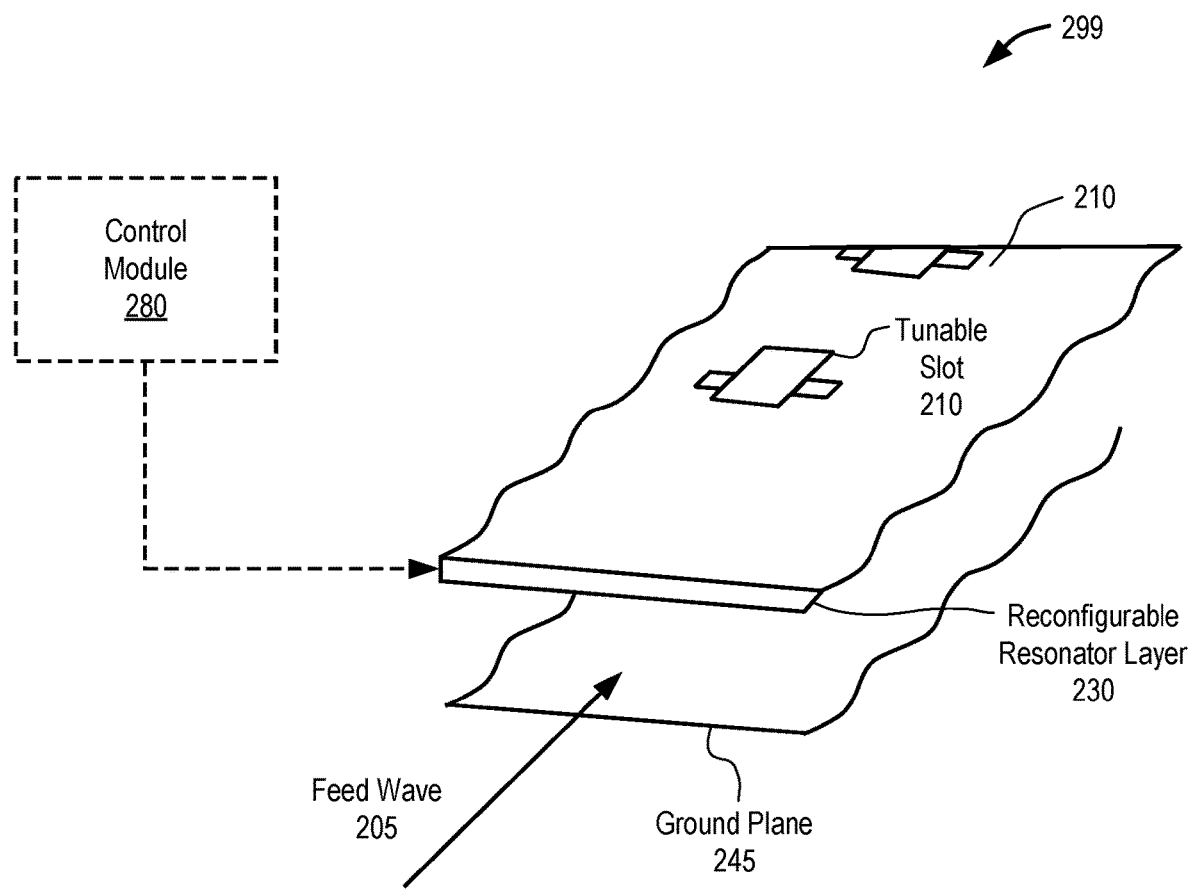
FIG. 4A illustrates a perspective view of one row of antenna elements that includes a ground plane and a reconfigurable resonator layer according to one example.

FIG. 4A illustrates a perspective view 299 of one row of antenna elements that includes a ground plane 245 and a reconfigurable resonator layer 230. Reconfigurable resonator layer 230 includes an array of tunable slots 210. The array of tunable slots 210 can be configured to point the antenna in a desired direction. Each of the tunable slots can be tuned/adjusted by varying a voltage across the liquid crystal.

Figure 4B:
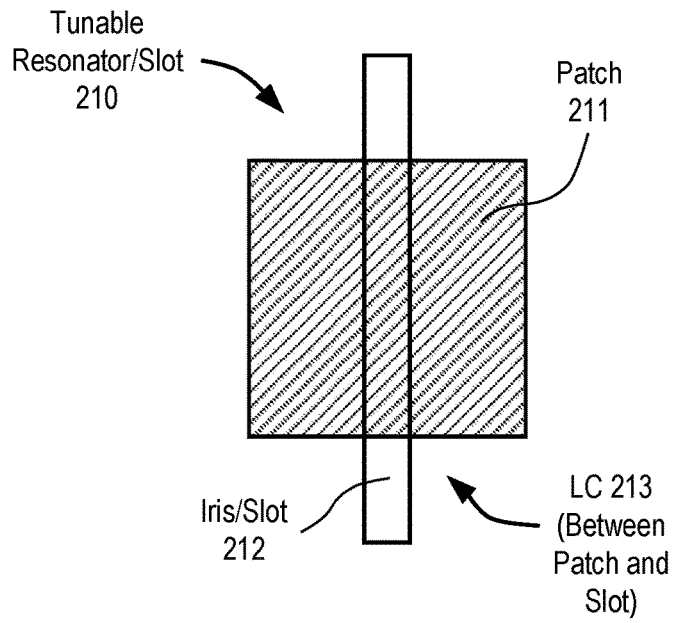
FIG. 4B illustrates one example of a tunable resonator/slot.

Control module 280 is coupled to reconfigurable resonator layer 230 to modulate the array of tunable slots 210 by varying the voltage across the liquid crystal in FIG. 4B. Control module 280 may include a Field Programmable Gate Array ("FPGA"), a microprocessor, a controller, System-on-a-Chip (SoC), or other processing logic. In one example, control module 280 includes logic circuitry (e.g., multiplexer) to drive the array of tunable slots 210. In one example, control module 280 receives data that includes specifications for a holographic diffraction pattern to be driven onto the array of tunable slots 210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 205 (approximately 20 GHz in some examples). To transform a feed wave into a radiated beam (either for transmitting or receiving purposes), an interference pattern is calculated between the desired RF beam (the object beam) and the feed wave (the reference beam). The interference pattern is driven onto the array of tunable slots 210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram}=w^*_{in}w_{out}$, with $w_{in}$ as the wave equation in the waveguide and $w_{out}$ the wave equation on the outgoing wave.

FIG. 4B illustrates one example of a tunable resonator/slot 210. Tunable slot 210 includes an iris/slot 212, a radiating patch 211, and liquid crystal (LC) 213 disposed between iris 212 and patch 211. In one example, radiating patch 211 is co-located with iris 212.

Figure 4C:
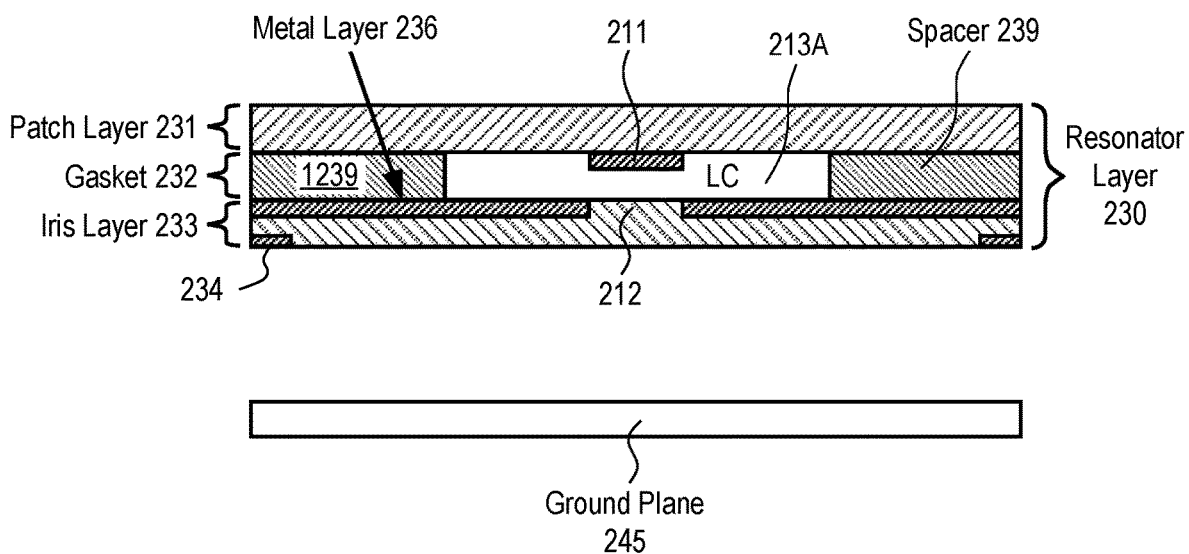
FIG. 4C illustrates a cross section view of one example of a physical antenna aperture.

FIG. 4C illustrates a cross section view of a physical antenna aperture according to one example. The antenna aperture includes ground plane 245, and a metal layer 236 within iris layer 233, which is included in reconfigurable resonator layer 230. In one example, the antenna aperture of FIG. 4C includes a plurality of tunable resonator/slots 210 of FIG. 4B. Iris/slot 212 is defined by openings in metal layer 236. A feed wave, such as feed wave 205 of FIG. 4A, may have a microwave frequency compatible with satellite communication channels. The feed wave propagates between ground plane 245 and resonator layer 230.

Reconfigurable resonator layer 230 also includes gasket layer 232 and patch layer 231. Gasket layer 232 is disposed between patch layer 231 and iris layer 233. In one example, a spacer could replace gasket layer 232. In one example, Iris layer 233 is a printed circuit board ("PCB") that includes a copper layer as metal layer 236. In one example, iris layer 233 is glass. Iris layer 233 may be other types of substrates.

Openings may be etched in the copper layer to form slots 212. In one example, iris layer 233 is conductively coupled by a conductive bonding layer to another structure (e.g., a waveguide) in FIG. 4C. Note that in an example the iris layer is not conductively coupled by a conductive bonding layer and is instead interfaced with a non-conducting bonding layer.

Patch layer 231 may also be a PCB that includes metal as radiating patches 211. In one example, gasket layer 232 includes spacers 239 that provide a mechanical standoff to define the dimension between metal layer 236 and patch 211. In one example, the spacers are 75 microns, but other sizes may be used (e.g., 3-200 mm). As mentioned above, in one example, the antenna aperture of FIG. 4C includes multiple tunable resonator/slots, such as tunable resonator/slot 210 includes patch 211, liquid crystal 213, and iris 212 of FIG. 4B. The chamber for liquid crystal 213 is defined by spacers 239, iris layer 233 and metal layer 236. When the chamber is filled with liquid crystal, patch layer 231 can be laminated onto spacers 239 to seal liquid crystal within resonator layer 230.

A voltage between patch layer 231 and iris layer 233 can be modulated to tune the liquid crystal in the gap between the patch and the slots (e.g., tunable resonator/slot 210). Adjusting the voltage across liquid crystal 213 varies the capacitance of a slot (e.g., tunable resonator/slot 210). Accordingly, the reactance of a slot (e.g., tunable resonator/slot 210) can be varied by changing the capacitance. Resonant frequency of slot 210 also changes according to the equation $$f = \frac{1}{2\pi\sqrt{LC}}$$

where f is the resonant frequency of slot 210 and L and C are the inductance and capacitance of slot 210, respectively. The resonant frequency of slot 210 affects the energy radiated from feed wave 205 propagating through the waveguide. As an example, if feed wave 205 is 20 GHz, the resonant frequency of a slot 210 may be adjusted (by varying the capacitance) to 17 GHz so that the slot 210 couples substantially no energy from feed wave 205. Or, the resonant frequency of a slot 210 may be adjusted to 20 GHz so that the slot 210 couples energy from feed wave 205 and radiates that energy into free space. Although the examples given are binary (fully radiating or not radiating at all), full grey scale control of the reactance, and therefore the resonant frequency of slot 210 is possible with voltage variance over a multi-valued range. Hence, the energy radiated from each slot 210 can be finely controlled so that detailed holographic diffraction patterns can be formed by the array of tunable slots.

In one example, tunable slots in a row are spaced from each other by $\lambda/5$. Other types of spacing may be used. In one example, each tunable slot in a row is spaced from the closest tunable slot in an adjacent row by $\lambda/2$, and, thus, commonly oriented tunable slots in different rows are spaced by $\lambda/4$, though other spacings are possible (e.g., $\lambda/5$, $\lambda/16.3$). In another example, each tunable slot in a row is spaced from the closest tunable slot in an adjacent row by $\lambda/3$.

Examples of the invention use reconfigurable metamaterial technology, such as described in U.S. patent application Ser. No. 14/550,178, entitled "Dynamic Polarization and Coupling Control from a Steerable Cylindrically Fed Holographic Antenna", filed Nov. 21, 2014 and U.S. patent application Ser. No. 14/610,502, entitled "Ridged Waveguide Feed Structures for Reconfigurable Antenna", filed Jan. 30, 2015, to the multi-aperture needs of the marketplace.

Figure 5A:
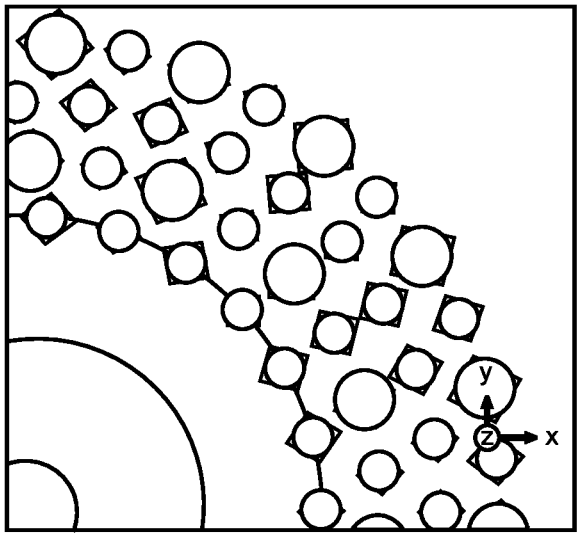
FIGS. 5A-5D illustrate one example of the different layers for creating the slotted array.
Figure 5B:
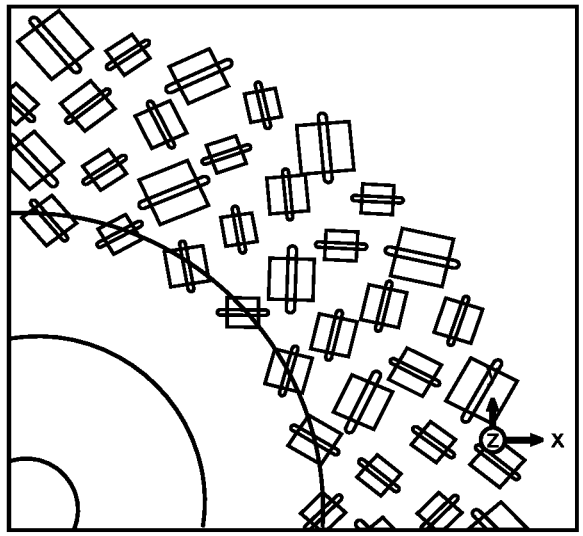
Figure 5C:
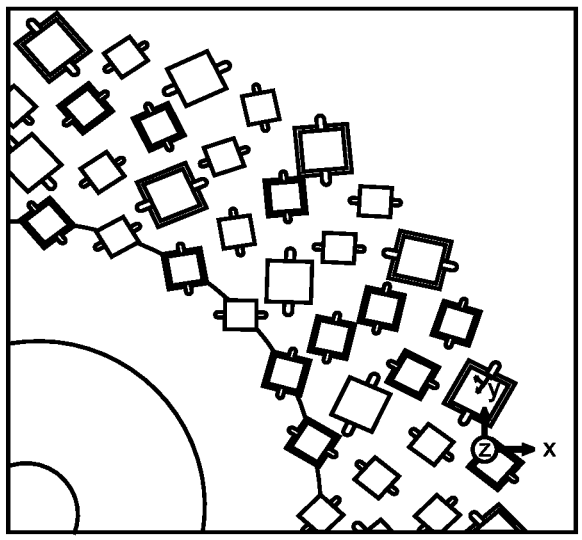
Figure 5D:
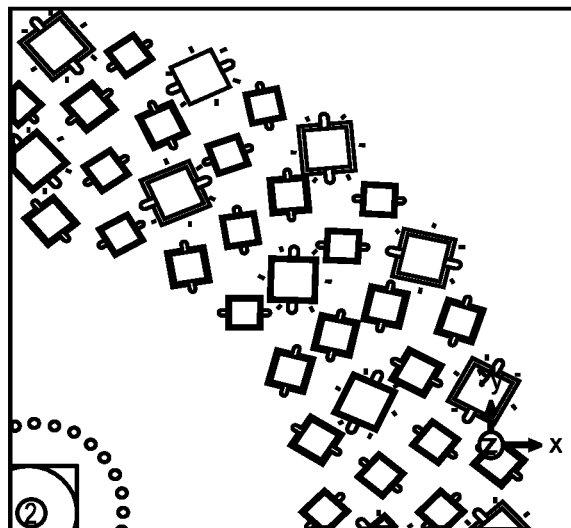

FIG. 5A-5D illustrate one example of the different layers for creating the slotted array. Note that in this example the antenna array has two different types of antenna elements that are used for two different types of frequency bands. FIG. 5A illustrates a portion of the first iris board layer with locations corresponding to the slots according to one example. Referring to FIG. 5A, the circles are open areas/slots in the metallization in the bottom side of the iris substrate, and are for controlling the coupling of elements to the feed (the feed wave). In this example, this layer is an optional layer and is not used in all designs. FIG. 5B illustrates a portion of the second iris board layer containing slots according to one example. FIG. 5C illustrates patches over a portion of the second iris board layer according to one example. FIG. 5D illustrates a top view of a portion of the slotted array according to one example.

Figure 6A:
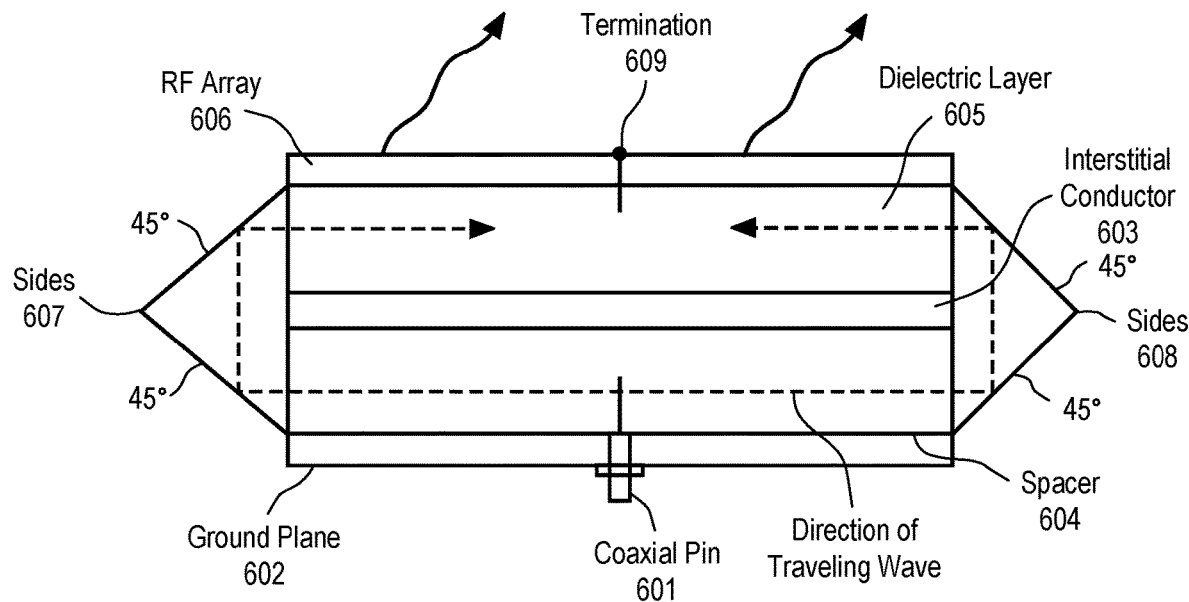
FIG. 6A illustrates a side view of one example of a cylindrically fed antenna structure.

FIG. 6A illustrates a side view of one example of a cylindrically fed antenna structure. The antenna produces an inwardly travelling wave using a double layer feed structure (i.e., two layers of a feed structure). In one example, the antenna includes a circular outer shape, though this is not required. That is, non-circular inward travelling structures can be used. In one example, the antenna structure in FIG. 6A includes a coaxial feed.

Referring to FIG. 6A, a coaxial pin 601 is used to excite the field on the lower level of the antenna. In one example, coaxial pin 601 is a 50Ω coax pin that is readily available. Coaxial pin 601 is coupled (e.g., bolted) to the bottom of the antenna structure, which is conducting ground plane 602.

Separate from conducting ground plane 602 is interstitial conductor 603, which is an internal conductor. In one example, conducting ground plane 602 and interstitial conductor 603 are parallel to each other. In one example, the distance between ground plane 602 and interstitial conductor 603 is 0.1-0.15". In another example, this distance may be $\lambda/2$, where $\lambda$ is the wavelength of the travelling wave at the frequency of operation.

Ground plane 602 is separated from interstitial conductor 603 via a spacer 604. In one example, spacer 604 is a foam or air-like spacer. In one example, spacer 604 comprises a plastic spacer.

On top of interstitial conductor 603 is dielectric layer 605. In one example, dielectric layer 605 is plastic. The purpose of dielectric layer 605 is to slow the travelling wave relative to free space velocity. In one example, dielectric layer 605 slows the travelling wave by 30% relative to free space. In one example, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric 605, such as periodic sub-wavelength metallic structures that can be machined or lithographically defined, for example.

An RF-array 606 is on top of dielectric 605. In one example, the distance between interstitial conductor 603 and RF-array 606 is 0.1-0.15". In another example, this distance may be $\lambda_{eff}/2$, where $\lambda_{eff}$ is the effective wavelength in the medium at the design frequency.

The antenna includes sides 607 and 608. Sides 607 and 608 are angled to cause a travelling wave feed from coax pin 601 to be propagated from the area below interstitial conductor 603 (the spacer layer) to the area above interstitial conductor 603 (the dielectric layer) via reflection. In one example, the angle of sides 607 and 608 are at 45° angles. In an alternative example, sides 607 and 608 could be replaced with a continuous radius to achieve the reflection. While FIG. 6A shows angled sides that have angle of 45 degrees, other angles that accomplish signal transmission from lower level feed to upper level feed may be used. That is, given that the effective wavelength in the lower feed will generally be different than in the upper feed, some deviation from the ideal 45° angles could be used to aid transmission from the lower to the upper feed level.

In operation, when a feed wave is fed in from coaxial pin 601, the wave travels outward concentrically oriented from coaxial pin 601 in the area between ground plane 602 and interstitial conductor 603. The concentrically outgoing waves are reflected by sides 607 and 608 and travel inwardly in the area between interstitial conductor 603 and RF array 606. The reflection from the edge of the circular perimeter causes the wave to remain in phase (i.e., it is an in-phase reflection). The travelling wave is slowed by dielectric layer 605. At this point, the travelling wave starts interacting and exciting with elements in RF array 606 to obtain the desired scattering.

To terminate the travelling wave, a termination 609 is included in the antenna at the geometric center of the antenna. In one example, termination 609 comprises a pin termination (e.g., a 50Ω pin). In another example, termination 609 comprises an RF absorber that terminates unused energy to prevent reflections of that unused energy back through the feed structure of the antenna. These could be used at the top of RF array 606.

Figure 6B:
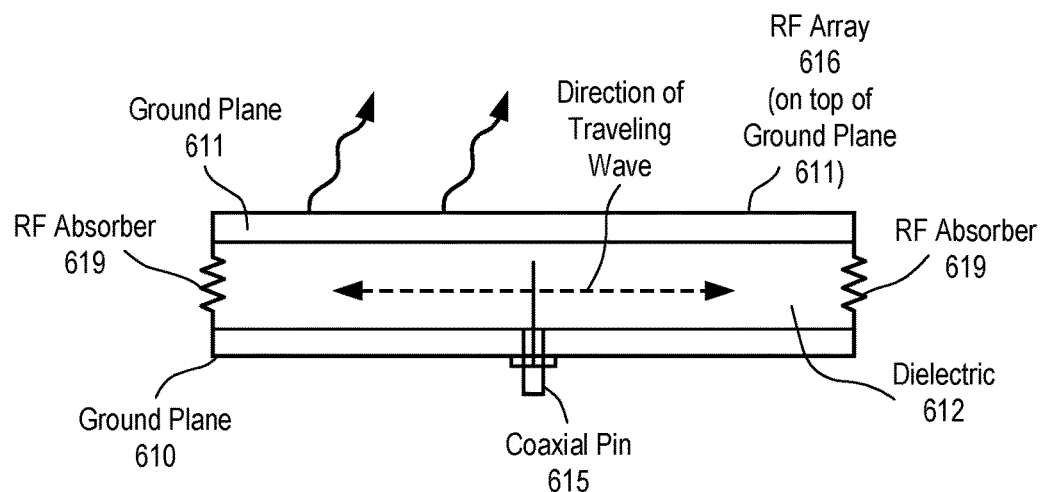
FIG. 6B illustrates another example of the antenna system with a cylindrical feed producing an outgoing wave.

FIG. 6B illustrates another example of the antenna system with an outgoing wave. Referring to FIG. 6B, two ground planes 610 and 611 are substantially parallel to each other with a dielectric layer 612 (e.g., a plastic layer, etc.) in between ground planes 610 and 611. RF absorbers 619 (e.g., resistors) couple the two ground planes 610 and 611 together. A coaxial pin 615 (e.g., 50Ω) feeds the antenna. An RF array 616 is on top of dielectric layer 612.

In operation, a feed wave is fed through coaxial pin 615 and travels concentrically outward and interacts with the elements of RF array 616.

The cylindrical feed in both the antennas of FIGS. 6A and 6B improves the service angle of the antenna. Instead of a service angle of plus or minus forty-five degrees azimuth (±45° Az) and plus or minus twenty five degrees elevation (±25° El), in one example, the antenna system has a service angle of seventy five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Examples of the antenna having a cylindrical feed solve one or more problems. These include dramatically simplifying the feed structure compared to antennas fed with a corporate divider network and therefore reducing total required antenna and antenna feed volume; decreasing sensitivity to manufacturing and control errors by maintaining high beam performance with coarser controls (extending all the way to simple binary control); giving a more advantageous side lobe pattern compared to rectilinear feeds because the cylindrically oriented feed waves result in spatially diverse side lobes in the far field; and allowing polarization to be dynamic, including allowing left-hand circular, right-hand circular, and linear polarizations, while not requiring a polarizer.

Array of Wave Scattering Elements

RF array 606 of FIG. 6A and RF array 616 of FIG. 6B include a wave scattering subsystem that includes a group of patch antennas (i.e., scatterers) that act as radiators. This group of patch antennas comprises an array of scattering metamaterial elements.

In one example, each scattering element in the antenna system is part of a unit cell that consists of a lower conductor, a dielectric substrate and an upper conductor that embeds a complementary electric inductive-capacitive resonator ("complementary electric LC" or "CELL") that is etched in or deposited onto the upper conductor.

In one example, a liquid crystal (LC) is injected in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, the liquid crystal acts as an on/off switch for the transmission of energy from the guided wave to the CELC. When switched on, the CELC emits an electromagnetic wave like an electrically small dipole antenna.

Controlling the thickness of the LC increases the beam switching speed. A fifty percent (50%) reduction in the gap between the lower and the upper conductor (the thickness of the liquid crystal) results in a fourfold increase in speed. In another example, the thickness of the liquid crystal results in a beam switching speed of approximately fourteen milliseconds (14 ms). In one example, the LC is doped in a manner well-known in the art to improve responsiveness so that a seven millisecond (7 ms) requirement can be met.

The CELC element is responsive to a magnetic field that is applied parallel to the plane of the CELC element and perpendicular to the CELC gap complement. When a voltage is applied to the liquid crystal in the metamaterial scattering unit cell, the magnetic field component of the guided wave induces a magnetic excitation of the CELC, which, in turn, produces an electromagnetic wave in the same frequency as the guided wave.

The phase of the electromagnetic wave generated by a single CELC can be selected by the position of the CELC on the vector of the guided wave. Each cell generates a wave in phase with the guided wave parallel to the CELC. Because the CELCs are smaller than the wave length, the output wave has the same phase as the phase of the guided wave as it passes beneath the CELC.

In one example, the cylindrical feed geometry of this antenna system allows the CELC elements to be positioned at forty-five degree (45°) angles to the vector of the wave in the wave feed. This position of the elements enables control of the polarization of the free space wave generated from or received by the elements. In one example, the CELCs are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one example, the CELCs are implemented with patch antennas that include a patch co-located over a slot with liquid crystal between the two. In this respect, the metamaterial antenna acts like a slotted (scattering) wave guide. With a slotted wave guide, the phase of the output wave depends on the location of the slot in relation to the guided wave.

Cell Placement

Figure 17:
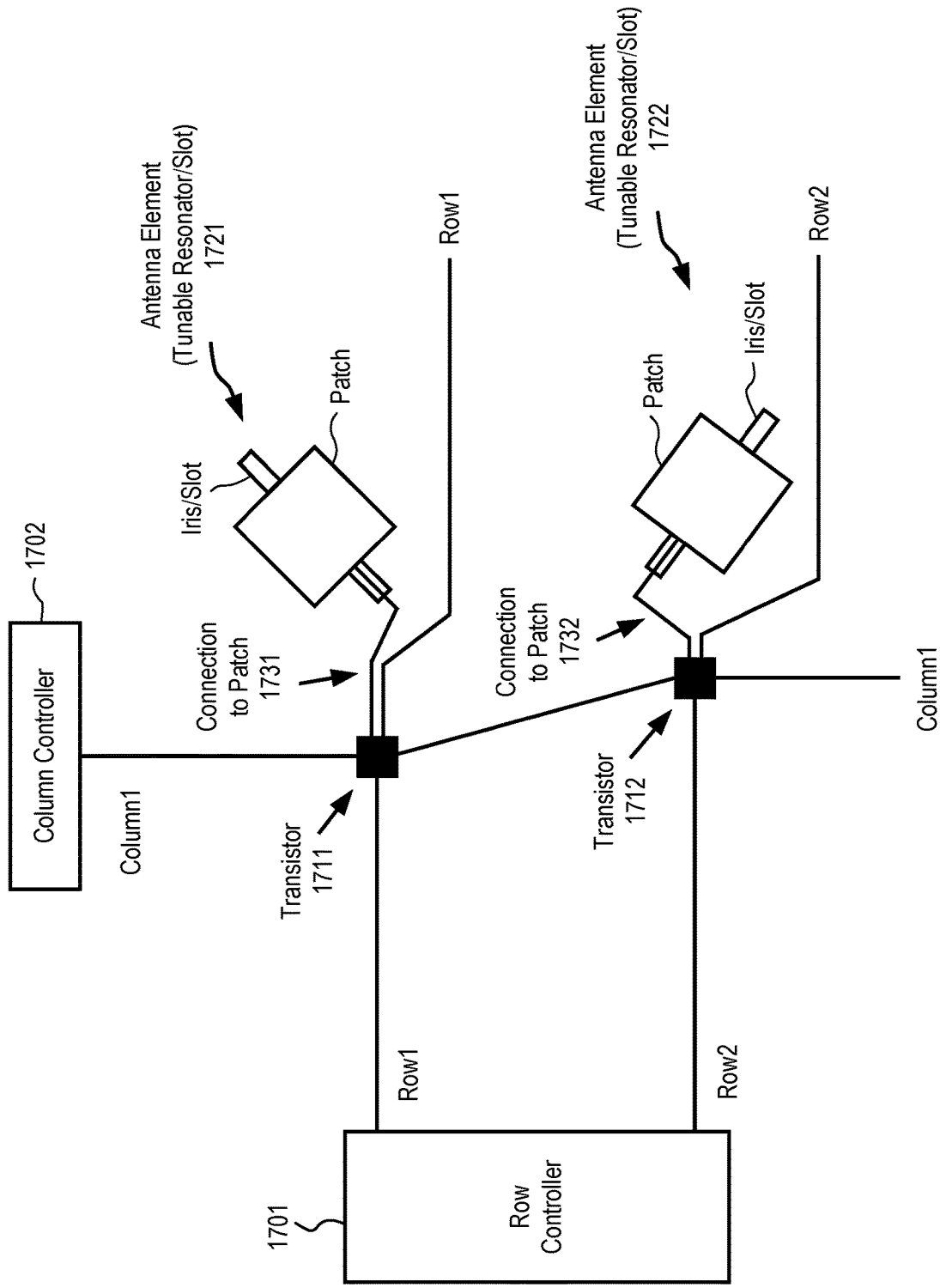
FIG. 17 illustrates one example of the placement of matrix drive circuitry with respect to antenna elements.

In one example, the antenna elements are placed on the cylindrical feed antenna aperture in a way that allows for a systematic matrix drive circuit. The placement of the cells includes placement of the transistors for the matrix drive. FIG. 17 illustrates one example of the placement of matrix drive circuitry with respect to antenna elements. Referring to FIG. 17, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

In one example, the matrix drive circuitry is predefined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 7:
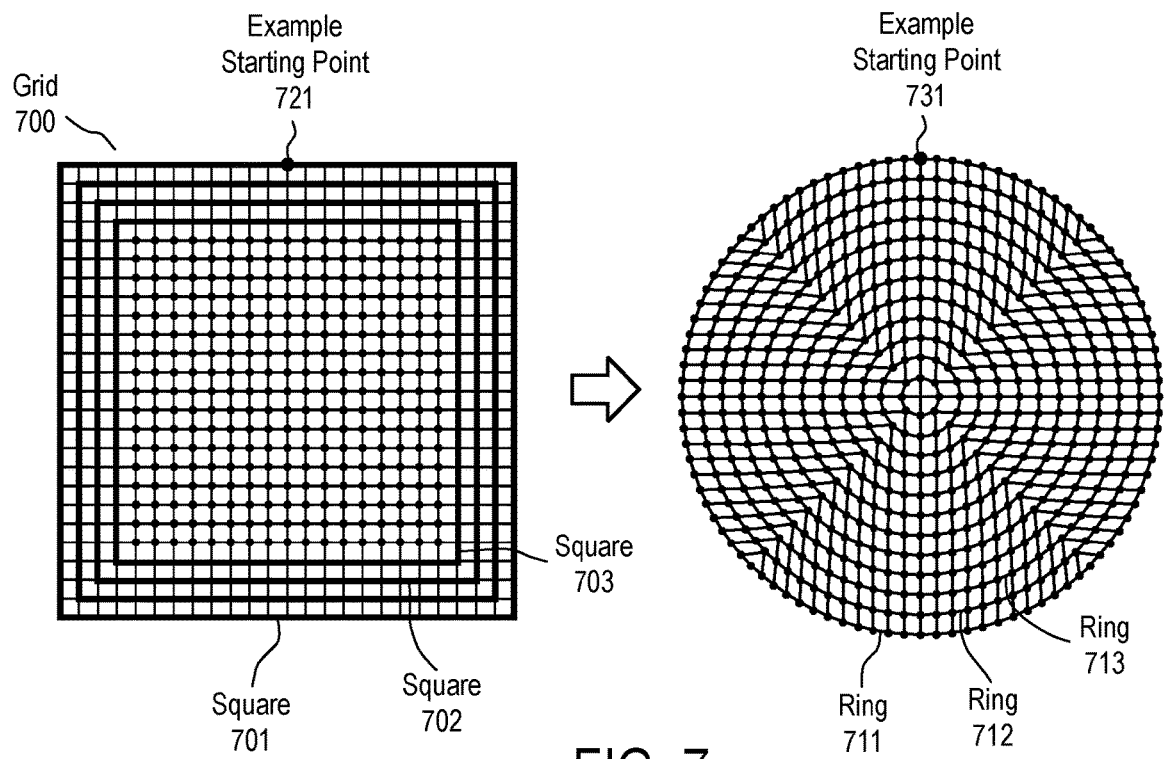
FIG. 7 shows an example where cells are grouped to form concentric squares (rectangles).

FIG. 7 shows an example where cells are grouped to form concentric squares (rectangles). Referring to FIG. 7, squares 701-703 are shown on the grid 700 of rows and columns. Note that these are examples of the squares and not all of the squares to create the cell placement on the right side of FIG. 7. Each of the squares, such as squares 701-703, are then, through a mathematical conformal mapping process, transformed into rings, such as rings 711-713 of antenna elements. For example, the outer ring 711 is the transformation of the outer square 701 on the left.

The density of the cells after the transformation is determined by the number of cells that the next larger square contains in addition to the previous square. In one example, using squares results in the number of additional antenna elements, ΔN, to be 8 additional cells on the next larger square. In one example, this number is constant for the entire aperture. In one example, the ratio of cellpitch1 (CP1: ring to ring distance) to cellpitch2 (CP2: distance cell to cell along a ring) is given by:

$$\frac{CP1}{CP2} = \frac{\Delta N}{2\pi}$$

Thus, CP2 is a function of CP1 (and vice versa). The cellpitch ratio for the example in FIG. 7 is then $$\frac{CP1}{CP2} = \frac{8}{2\pi} = 1.2732$$

which means that the CP1 is larger than CP2.

In one example, to perform the transformation, a starting point on each square, such as starting point 721 on square 701, is selected and the antenna element associated with that starting point is placed on one position of its corresponding ring, such as starting point 731 on ring 711. For example, the x-axis or y-axis may be used as the starting point. Thereafter, the next element on the square proceeding in one direction (clockwise or counterclockwise) from the starting point is selected and that element placed on the next location on the ring going in the same direction (clockwise or counterclockwise) that was used in the square. This process is repeated until the locations of all the antenna elements have been assigned positions on the ring. This entire square to ring transformation process is repeated for all squares.

Figure 8:
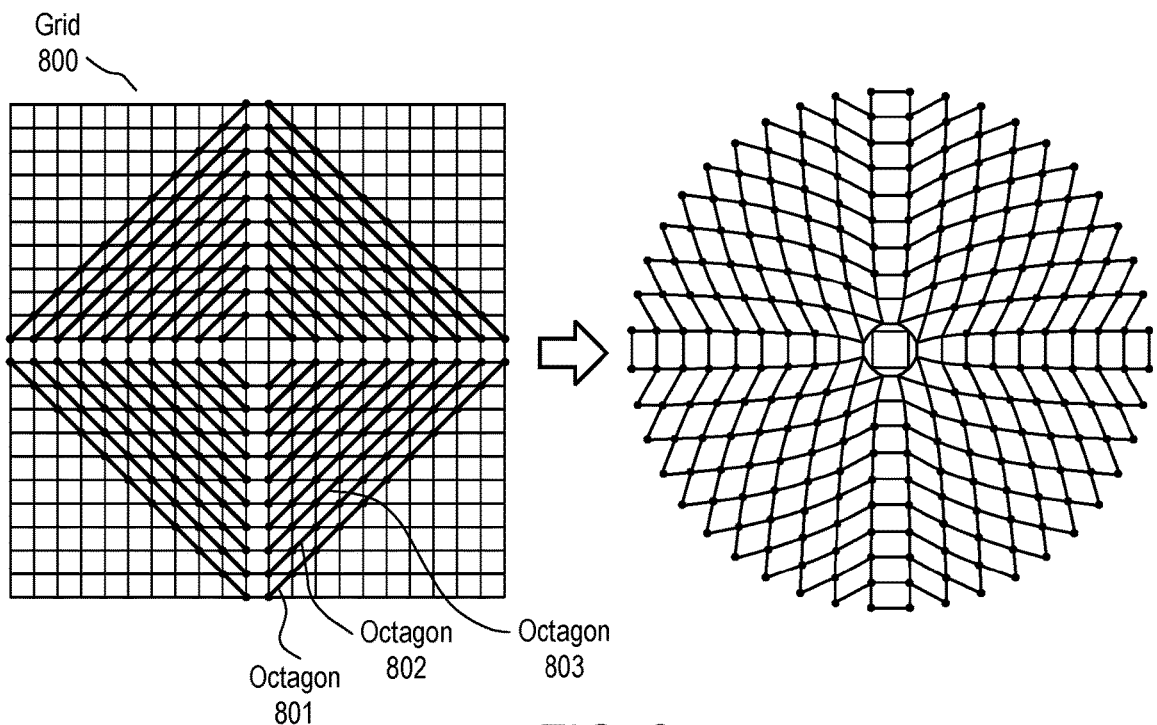
FIG. 8 shows an example where cells are grouped to form concentric octagons.

However, according to analytical studies and routing constraints, it is preferred to apply a CP2 larger than CP1. To accomplish this, a second strategy shown in FIG. 8 is used. Referring to FIG. 8, the cells are grouped initially into octagons, such as octagons 801-803, with respect to a grid 800. By grouping the cells into octagons, the number of additional antenna elements ΔN equals 4, which gives a ratio.

$$\frac{CP1}{CP2} = \frac{4}{2\pi} = 0.6366$$

which results in CP2>CP1.

The transformation from octagon to concentric rings for cell placement according to FIG. 8 can be performed in the same manner as that described above with respect to FIG. 7 by initially selecting a starting point.

Note that the cell placements disclosed with respect to FIGS. 7 and 8 have a number of features. These features include:
1) A constant CP1/CP2 over the entire aperture (Note that in one example an antenna that is substantially constant (e.g., being 90% constant) over the aperture will still function);
2) CP2 is a function of CP1;
3) There is a constant increase per ring in the number of antenna elements as the ring distance from the centrally located antenna feed increases;
4) All the cells are connected to rows and columns of the matrix;
5) All the cells have unique addresses;
6) The cells are placed on concentric rings; and
7) There is rotational symmetry in that the four quadrants are identical and a ¼ wedge can be rotated to build out the array. This is beneficial for segmentation.

In other examples, while two shapes are given, other shapes may be used. Other increments are also possible (e.g., 6 increments).

Figure 9:
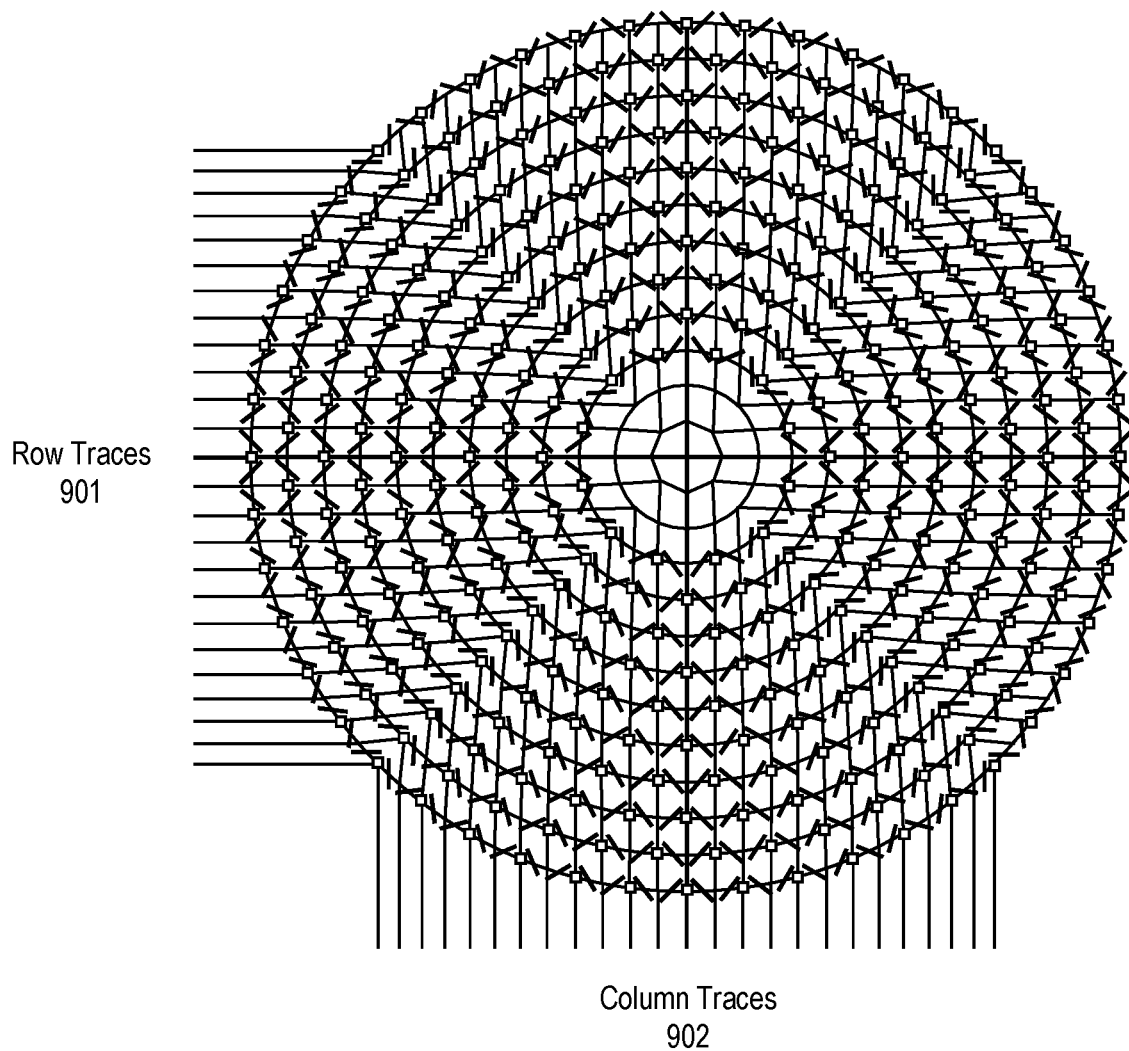
FIG. 9 shows an example of a small aperture including the irises and the matrix drive circuitry.

FIG. 9 shows an example of a small aperture including the irises and the matrix drive circuitry. The row traces 901 and column traces 902 represent row connections and column connections, respectively. These lines describe the matrix drive network and not the physical traces (as physical traces may have to be routed around antenna elements, or parts thereof). The square next to each pair of irises is a transistor. FIG. 9 also shows the potential of the cell placement technique for using dual-transistors where each component drives two cells in a PCB array. In this case, one discrete device package contains two transistors, and each transistor drives one cell.

Figure 18:
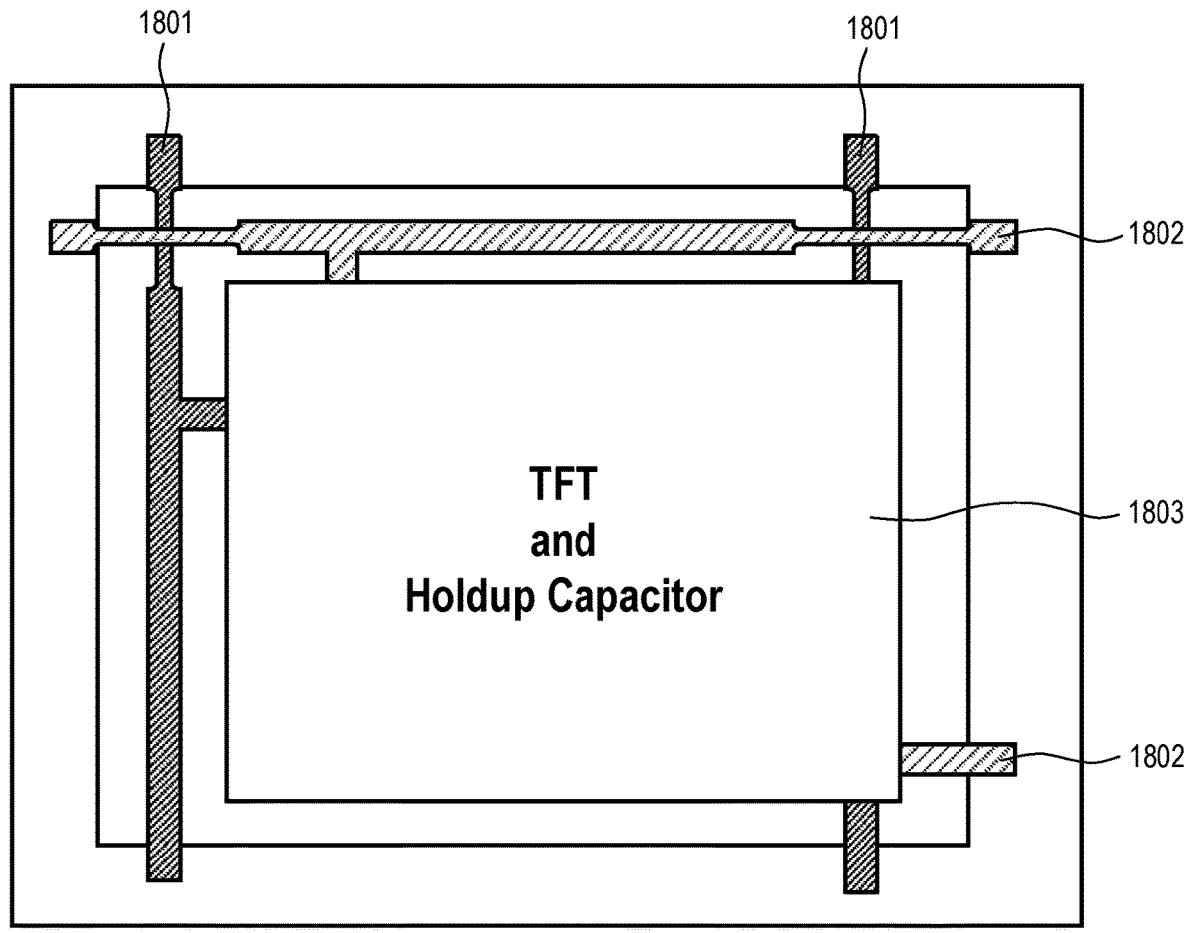
FIG. 18 illustrates one example of a TFT package.

In one example, a TFT package is used to enable placement and unique addressing in the matrix drive. FIG. 18 illustrates one example of a TFT package. Referring to FIG. 18, a TFT and a hold capacitor 1803 is shown with input and output ports. There are two input ports connected to traces 1801 and two output ports connected to traces 1802 to connect the TFTs together using the rows and columns. In one example, the row and column traces cross in 90° angles to reduce, and potentially minimize, the coupling between the row and column traces. In one example, the row and column traces are on different layers.

Another important feature of the proposed cell placement shown in FIGS. 7-9 is that the layout is a repeating pattern in which each quarter of the layout is the same as the others. This allows the sub-section of the array to be repeated rotation-wise around the location of the central antenna feed, which in turn allows a segmentation of the aperture into sub-apertures. This helps in fabricating the antenna aperture.

In another example, the matrix drive circuitry and cell placement on the cylindrical feed antenna is accomplished in a different manner. To realize matrix drive circuitry on the cylindrical feed antenna, a layout is realized by repeating a subsection of the array rotation-wise. This example also allows the cell density that can be used for illumination tapering to be varied to improve the RF performance.

Figure 10:
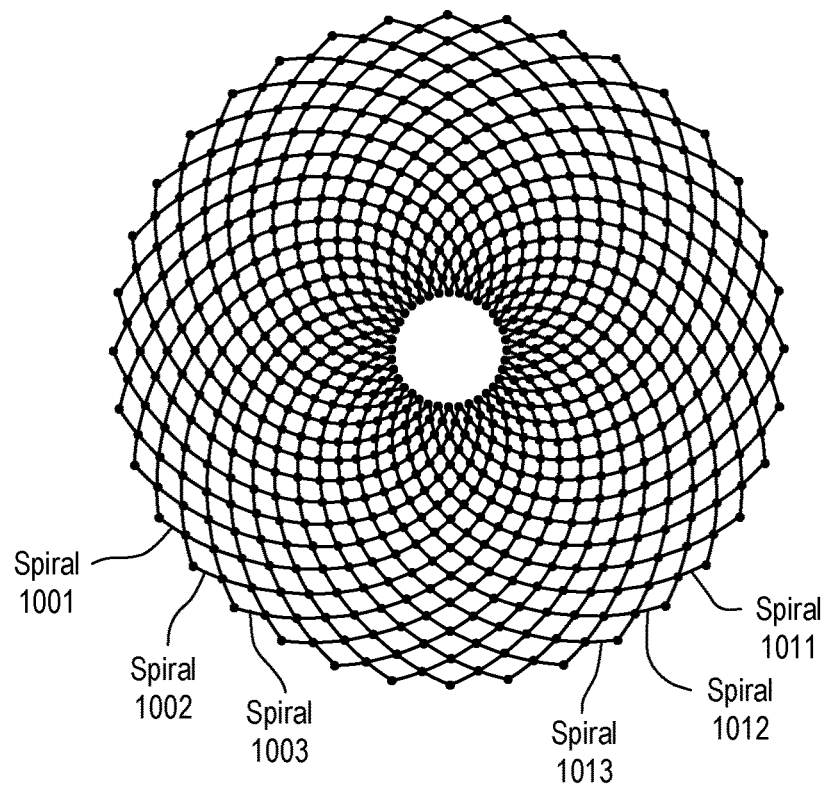
FIG. 10 shows an example of lattice spirals used for cell placement.

In this alternative approach, the placement of cells and transistors on a cylindrical feed antenna aperture is based on a lattice formed by spiral shaped traces. FIG. 10 shows an example of such lattice clockwise spirals, such as spirals 1001-1003, which bend in a clockwise direction and the spirals, such as spirals 1011-1013, which bend in a clockwise, or opposite, direction. The different orientation of the spirals results in intersections between the clockwise and counterclockwise spirals. The resulting lattice provides a unique address given by the intersection of a counterclockwise trace and a clockwise trace and can therefore be used as a matrix drive lattice. Furthermore, the intersections can be grouped on concentric rings, which is crucial for the RF performance of the cylindrical feed antenna.

Unlike the approaches for cell placement on the cylindrical feed antenna aperture discussed above, the approach discussed above in relation to FIG. 10 provides a non-uniform distribution of the cells. As shown in FIG. 10, the distance between the cells increases with the increase in radius of the concentric rings. In one example, the varying density is used as a method to incorporate an illumination tapering under control of the controller for the antenna array.

Figure 11:
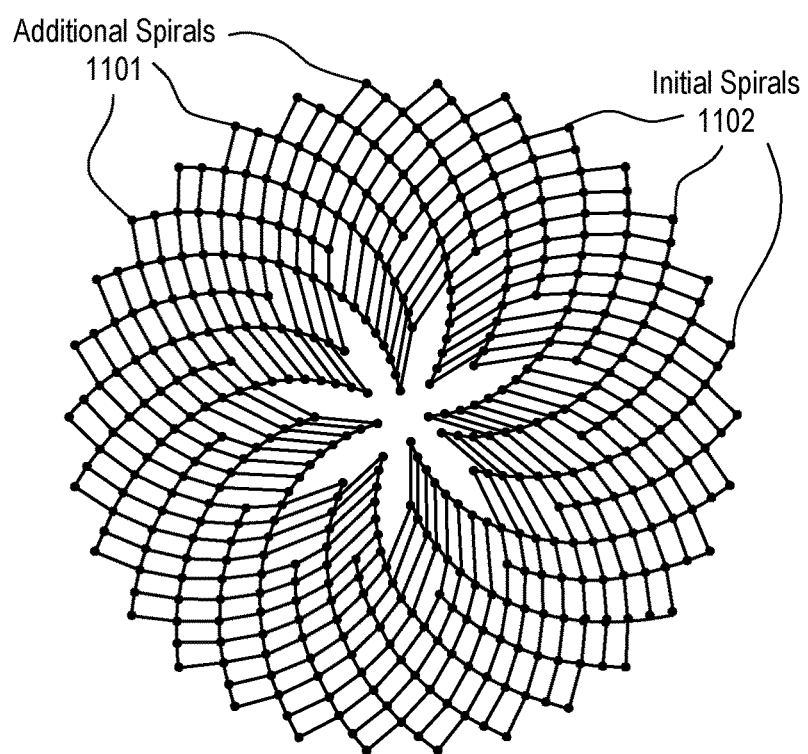
FIG. 11 shows an example of cell placement that uses additional spirals to achieve a more uniform density.

Due to the size of the cells and the required space between them for traces, the cell density cannot exceed a certain number. In one example, the distance is λ/5 based on the frequency of operation. As described above, other distances may be used. In order to avoid an overpopulated density close to the center, or in other words to avoid an underpopulation close to the edge, additional spirals can be added to the initial spirals as the radius of the successive concentric rings increases. FIG. 11 shows an example of cell placement that uses additional spirals to achieve a more uniform density. Referring to FIG. 11, additional spirals 1101, are added to the initial spirals, such as spirals 1102, as the radius of the successive concentric rings increases. According to analytical simulations, this approach provides an RF performance that converges the performance of an entirely uniform distribution of cells. In one example, this design provides a better sidelobe behavior because of the tapered element density than some examples described above.

Figure 12:
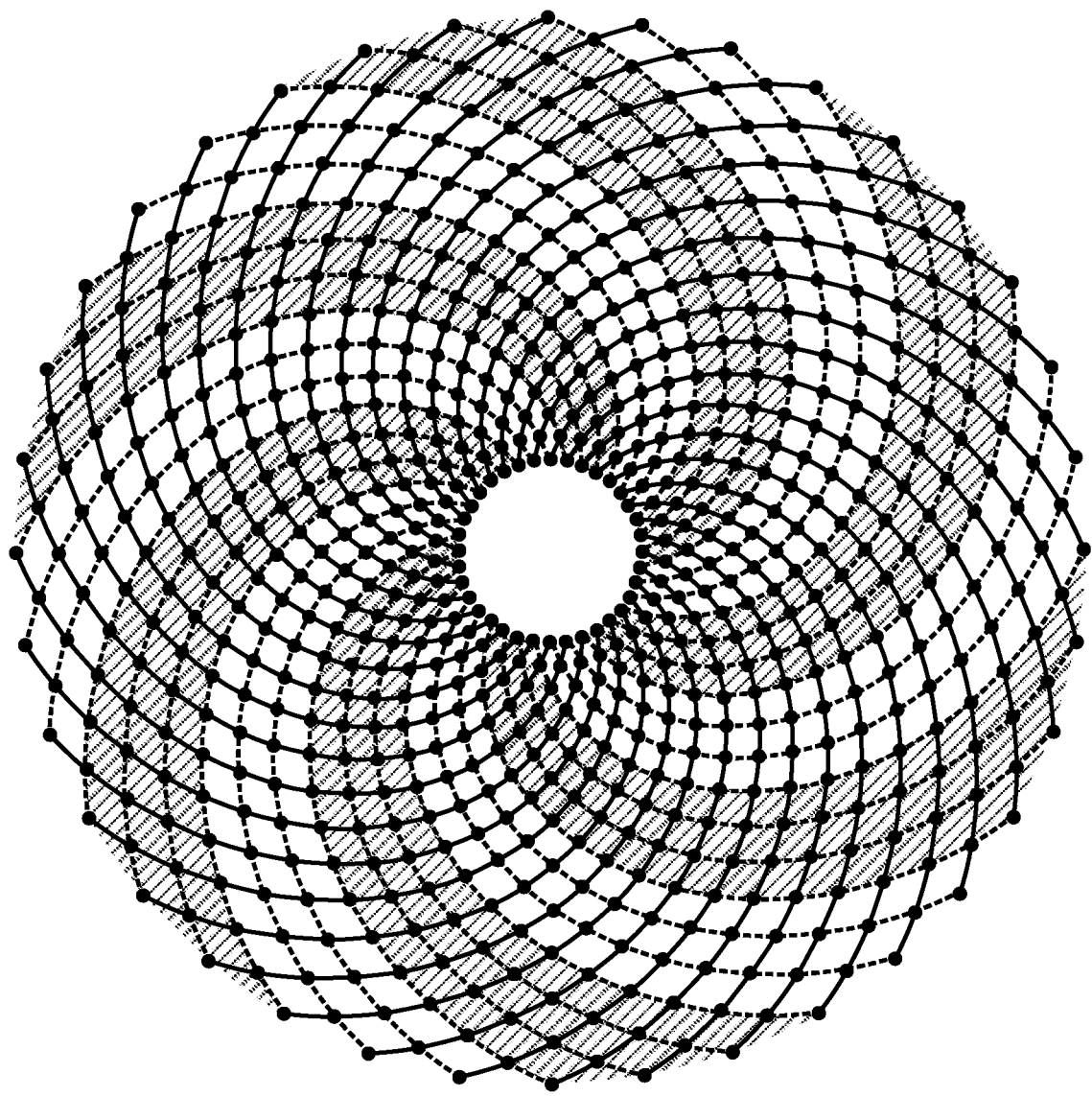
FIG. 12 illustrates a selected pattern of spirals that is repeated to fill the entire aperture according to one example.

Another advantage of the use of spirals for cell placement is the rotational symmetry and the repeatable pattern which can simplify the routing efforts and reducing fabrication costs. FIG. 12 illustrates a selected pattern of spirals that is repeated to fill the entire aperture.

In one example, the cell placements disclosed with respect to FIGS. 10-12 have a number of features. These features include:
1) CP1/CP2 is not over the entire aperture;
2) CP2 is a function of CP1;
3) There is no increase per ring in the number of antenna elements as the ring distance from the centrally located antenna feed increases;
4) All the cells are connected to rows and columns of the matrix;
5) All the cells have unique addresses;
6) The cells are placed on concentric rings; and
7) There is rotational symmetry (as described above).

Thus, the cell placement examples described above in conjunction with FIGS. 10-12 have many similar features to the cell placement examples described above in conjunction with FIGS. 7-9.

Aperture Segmentation

In one example, the antenna aperture is created by combining multiple segments of antenna elements together. This requires that the array of antenna elements be segmented and the segmentation ideally requires a repeatable footprint pattern of the antenna. In one example, the segmentation of a cylindrical feed antenna array occurs such that the antenna footprint does not provide a repeatable pattern in a straight and inline fashion due to the different rotation angles of each radiating element. One goal of the segmentation approach disclosed herein is to provide segmentation without compromising the radiation performance of the antenna.

While segmentation techniques described herein focuses improving, and potentially maximizing, the surface utilization of industry standard substrates with rectangular shapes, the segmentation approach is not limited to such substrate shapes.

In one example, segmentation of a cylindrical feed antenna is performed in a way that the combination of four segments realize a pattern in which the antenna elements are placed on concentric and closed rings. This aspect is important to maintain the RF performance. Furthermore, in one example, each segment requires a separate matrix drive circuitry.

Figure 13:
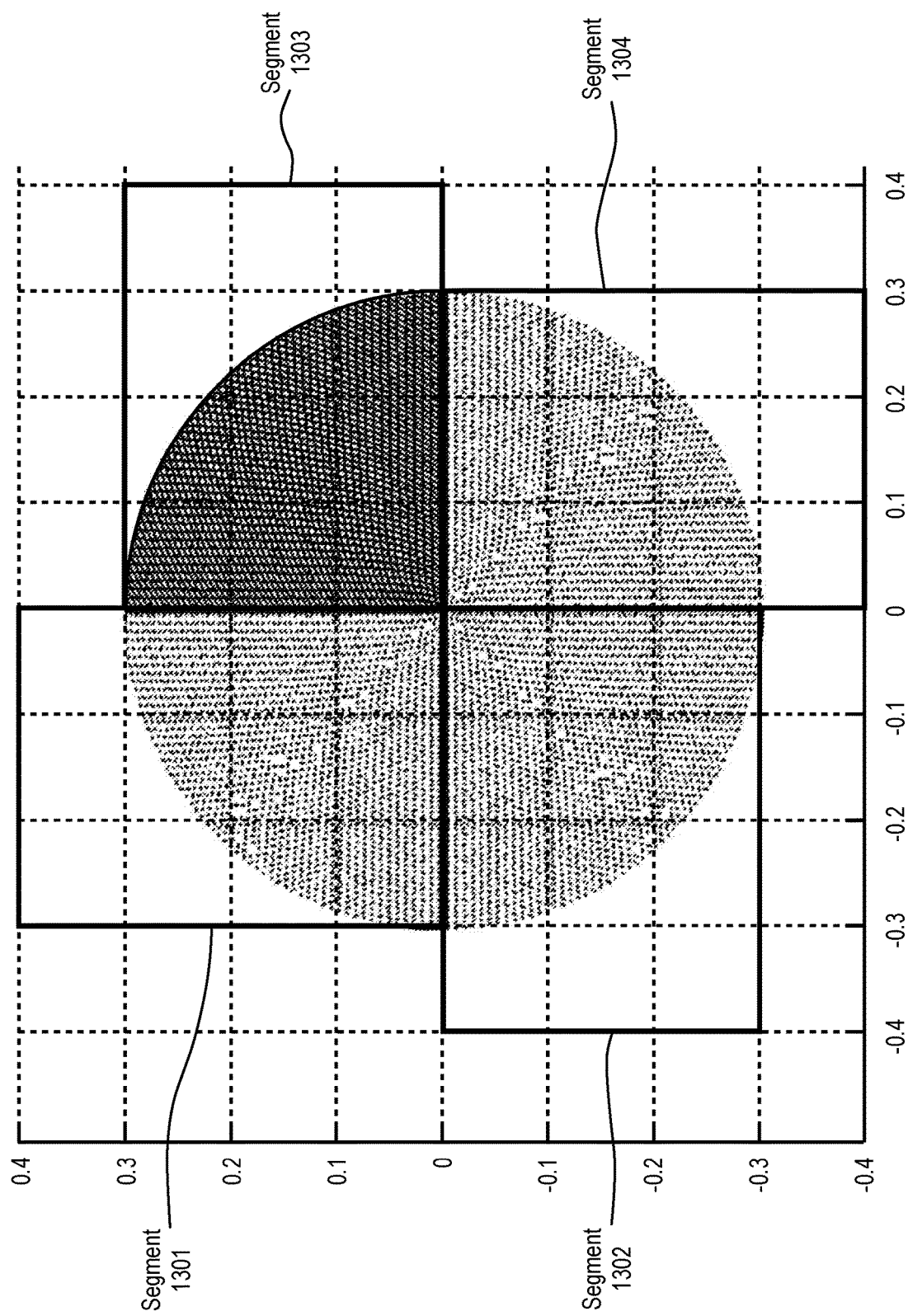
FIG. 13 illustrates one embodiment of segmentation of a cylindrical feed aperture into quadrants according to one example.

FIG. 13 illustrates segmentation of a cylindrical feed aperture into quadrants. Referring to FIG. 13, segments 1301-1304 are identical quadrants that are combined to build a round antenna aperture. The antenna elements on each of segments 1301-1304 are placed in portions of rings that form concentric and closed rings when segments 1301-1304 are combined. To combine the segments, segments are mounted or laminated to a carrier. In another example, overlapping edges of the segments are used to combine them together. In this case, in one example, a conductive bond is created across the edges to prevent RF from leaking. Note that the element type is not affected by the segmentation.

As the result of this segmentation method illustrated in FIG. 13, the seams between segments 1301-1304 meet at the center and go radially from the center to the edge of the antenna aperture. This configuration is advantageous since the generated currents of the cylindrical feed propagate radially and a radial seam has a low parasitic impact on the propagated wave.

Figure 14B:
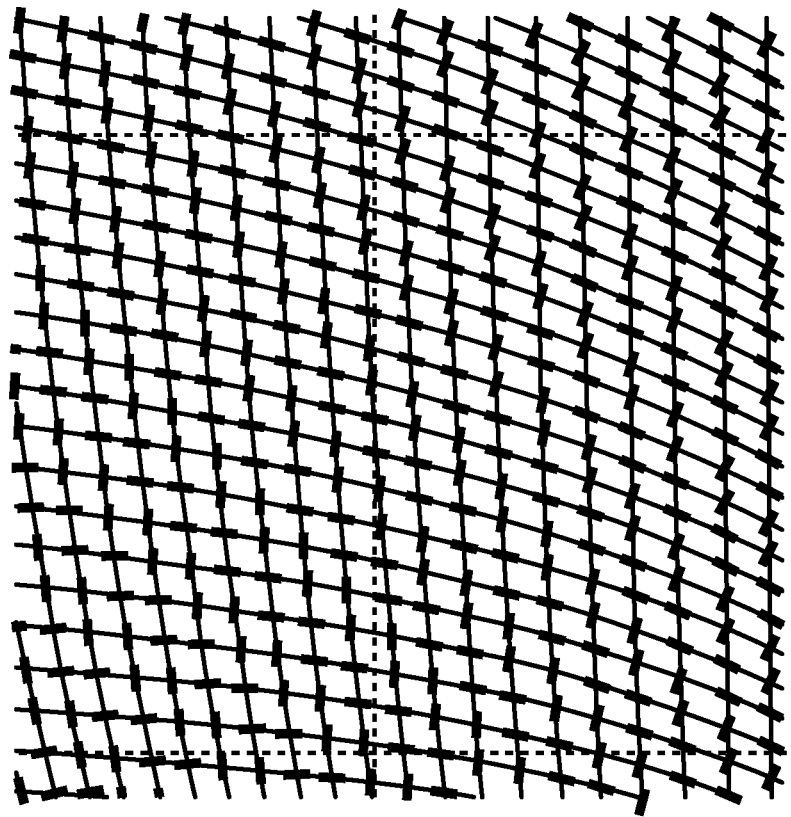
FIGS. 14A and 14B illustrate a single segment of FIG. 13 with the applied matrix drive lattice according to one example.
Figure 14A:
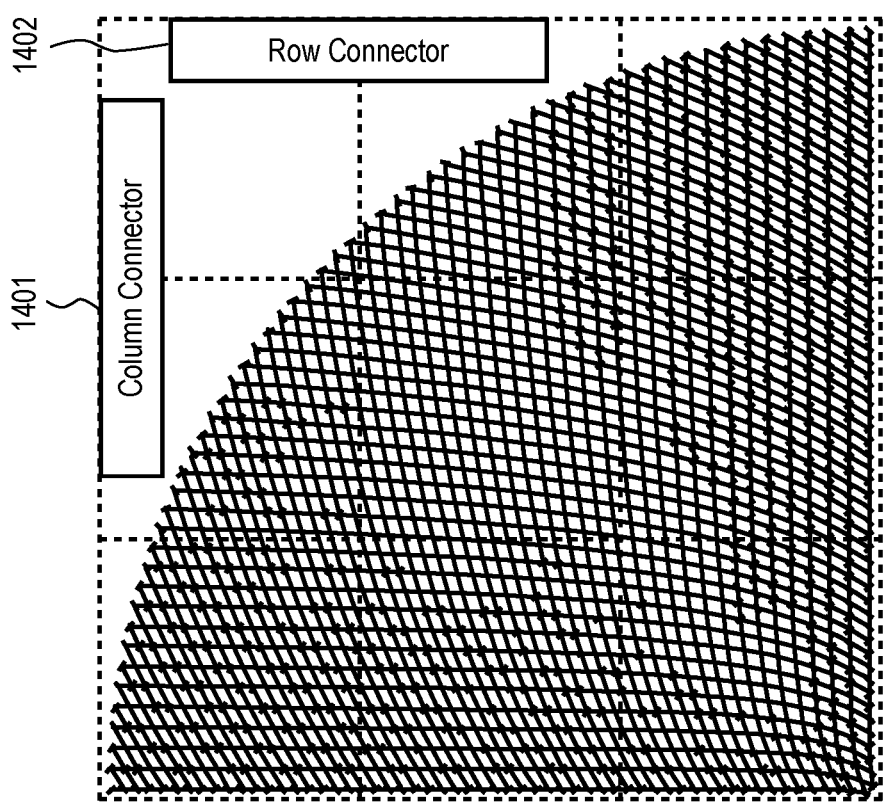

As shown in FIG. 13, rectangular substrates, which are a standard in the LCD industry, can also be used to realize an aperture. FIGS. 14A and 14B illustrate a single segment of FIG. 13 with the applied matrix drive lattice. The matrix drive lattice assigns a unique address to each of transistor. Referring to FIGS. 14A and 14B, a column connector 1401 and row connector 1402 are coupled to drive lattice lines. FIG. 14B also shows irises coupled to lattice lines.

Figure 15:
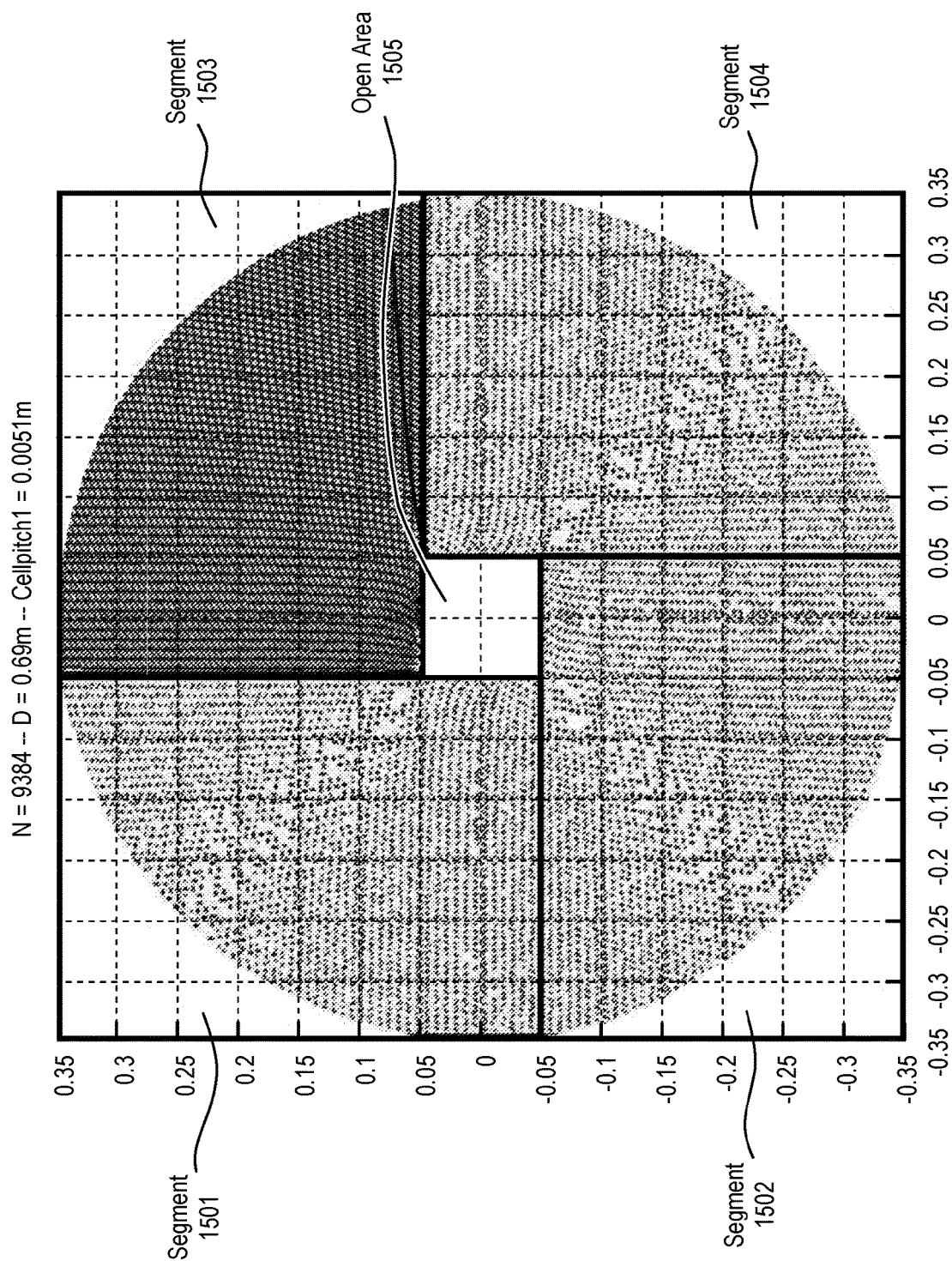
FIG. 15 illustrates another example of segmentation of a cylindrical feed aperture into quadrants.

As is evident from FIG. 13, a large area of the substrate surface cannot be populated if a non-square substrate is used. In order to have a more efficient usage of the available surface on a non-square substrate, in another example, the segments are on rectangular boards but utilize more of the board space for the segmented portion of the antenna array. One example of such an example is shown in FIG. 15. Referring to FIG. 15, the antenna aperture is created by combining segments 1501-1504, which comprises substrates (e.g., boards) with a portion of the antenna array included therein. While each segment does not represent a circle quadrant, the combination of four segments 1501-1504 closes the rings on which the elements are placed. That is, the antenna elements on each of segments 1501-1504 are placed in portions of rings that form concentric and closed rings when segments 1501-1504 are combined. In one example, the substrates are combined in a sliding tile fashion, so that the longer side of the non-square board introduces a rectangular open area 1505. Open area 1505 is where the centrally located antenna feed is located and included in the antenna.

The antenna feed is coupled to the rest of the segments when the open area exists because the feed comes from the bottom, and the open area can be closed by a piece of metal to prevent radiation from the open area. A termination pin may also be used.

The use of substrates in this fashion allows use of the available surface area more efficiently and results in an increased aperture diameter.

Figure 16B:
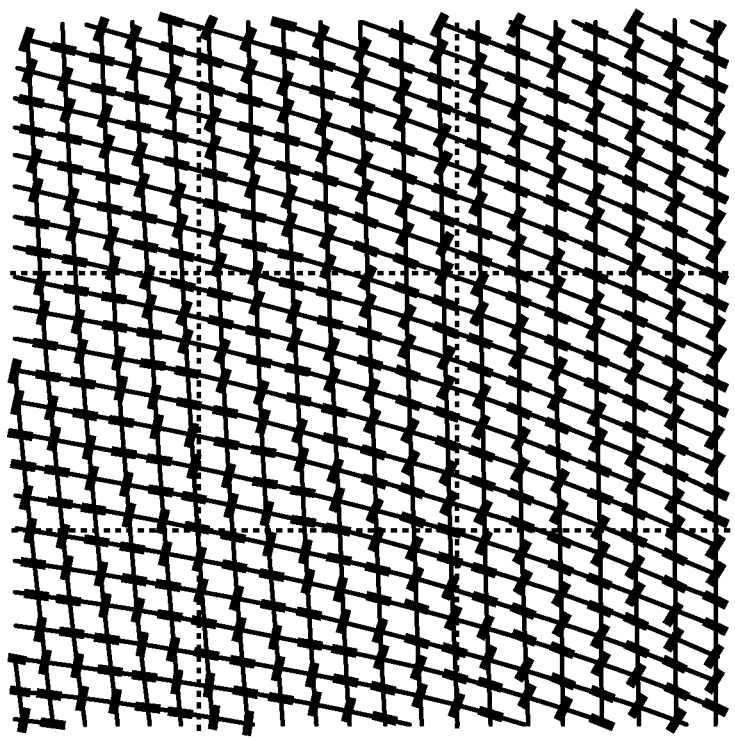
FIGS. 16A and 16B illustrate a single segment of FIG. 15 with the applied matrix drive lattice.
Figure 16A:
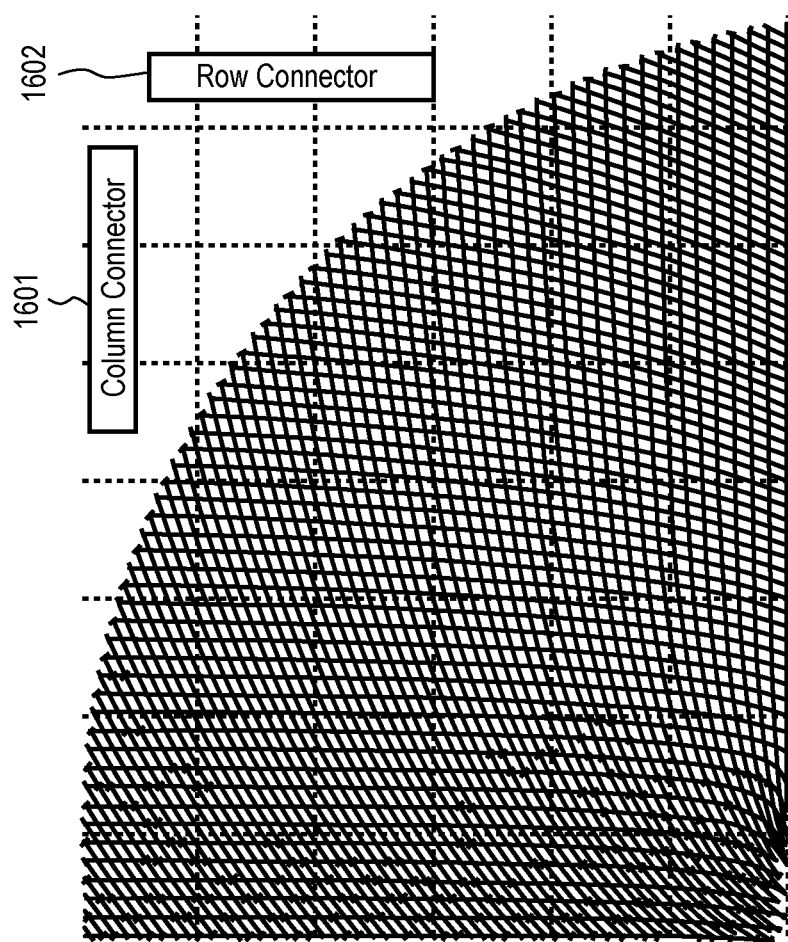

Similar to the example shown in FIGS. 13, 14A and 14B, this example allows use of a cell placement strategy to obtain a matrix drive lattice to cover each cell with a unique address. FIGS. 16A and 16B illustrate a single segment of FIG. 15 with the applied matrix drive lattice. The matrix drive lattice assigns a unique address to each of transistor. Referring to FIGS. 16A and 16B, a column connector 1601 and row connector 1602 are coupled to drive lattice lines. FIG. 16B also shows irises.

For both approaches described above, the cell placement may be performed based on a recently disclosed approach which allows the generation of matrix drive circuitry in a systematic and predefined lattice, as described above.

Figure 19B:
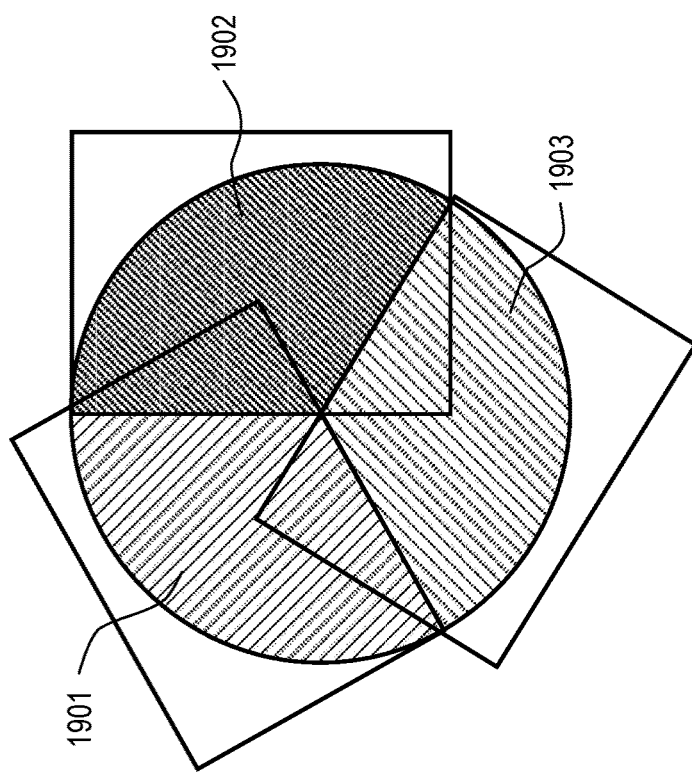
FIGS. 19A and 19B illustrate one example of an antenna aperture with an odd number of segments.
Figure 19A:
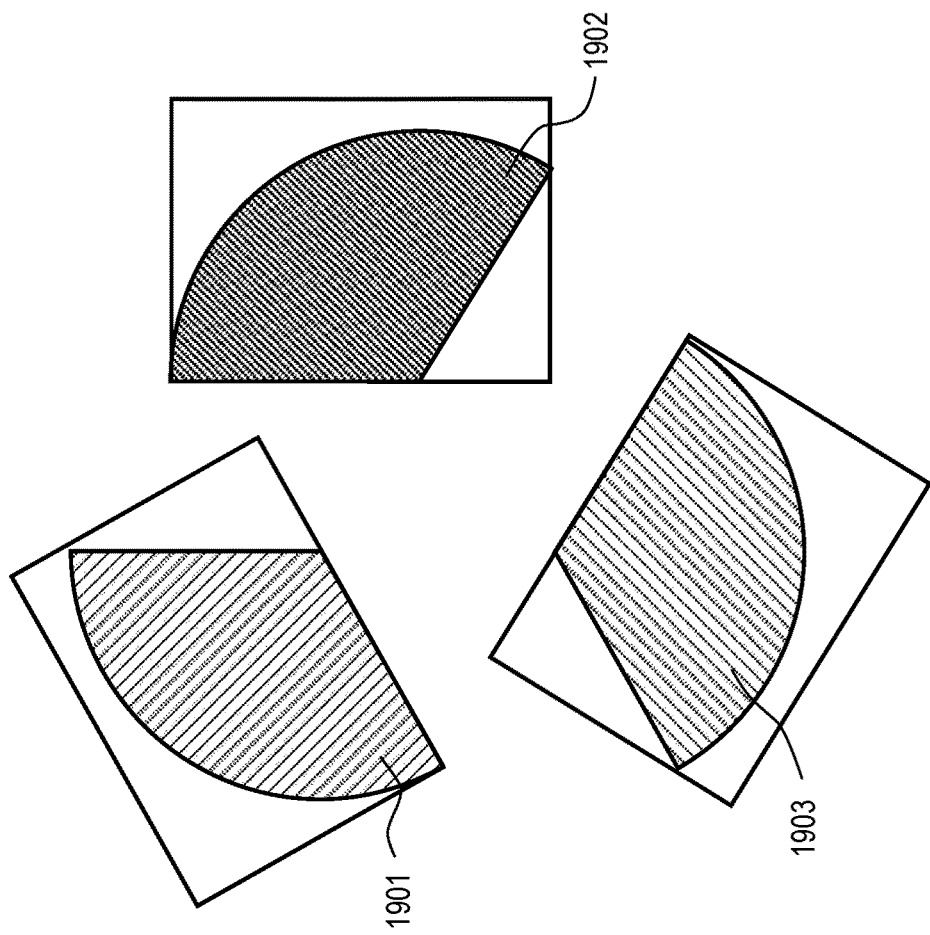

While the segmentations of the antenna arrays above are into four segments, this is not a requirement. The arrays may be divided into an odd number of segments, such as, for example, three segments or five segments. FIGS. 19A and 19B illustrate one example of an antenna aperture with an odd number of segments. Referring to FIG. 19A, there are three segments, segments 1901-1903, that are not combined. Referring to FIG. 19B, the three segments, segments 1901-1903, when combined, form the antenna aperture. These arrangements are not advantageous because the seams of all the segments do not go all the way through the aperture in a straight line. However, they do mitigate sidelobes.

There is a number of example embodiments described herein.

Example 1 is apparatus comprising: a frame having a platform to support an array of radio-frequency (RF) antenna elements of a flat panel antenna having antenna elements; a first antenna to transmit microwave energy to subsets of RF antenna elements of the array and to receive reflected microwave energy from the subsets of RF antenna elements; a filter between the array and the first antenna, the filter comprising an opening positioned over each of the subsets of RF antenna elements at different times to expose said each of the subsets of RF antenna elements to microwave energy transmitted by the first antenna; a second antenna to receive microwave energy transmitted though the subsets of RF antenna elements at the different times; a controller coupled to the subsets of RF antenna elements and to provide at least one stimulus or condition to the subsets of RF antenna elements; and an analyzer to provide stimulus to the subsets of RF antenna elements and to measure a characteristic of the array using one or both of the first antenna and second antenna.

Example 2 is the apparatus of example 1 that may optionally include that the filter comprises an RF absorbing material with the opening.

Example 3 is the apparatus of example 1 that may optionally include a mechanical structure to move the filter to align the opening with each of the subsets of antenna elements.

Example 4 is the apparatus of example 1 that may optionally include a mechanical structure to move the array to align the opening with each of the subsets of antenna elements.

Example 5 is the apparatus of example 1 that may optionally include that the controller is operable to drive the antenna elements in each of the subsets to a resonance frequency at the different times while driving all other elements at a frequency away from that resonance frequency.

Example 6 is the apparatus of example 1 that may optionally include that the analyzer is operable to measure a microwave frequency response at one or both of the first antenna or the second antenna for the array.

Example 7 is the apparatus of example 6 that may optionally include that the analyzer is operable to measure a transmission response at the second antenna and a reflection response at the first antenna for the array.

Example 8 is the apparatus of example 7 that may optionally include a computer coupled to the controller and the analyzer and to tune based on at least one of the transmission response or the reflection response for the RF antenna elements in the array.

Example 9 is the apparatus of example 8 that may optionally include that the computer is operable to characterize the one or both of the transmission response or the reflection response characteristics for the array.

Example 10 is the apparatus of example 1 that may optionally include that the array is used in the flat panel antenna if the measured characteristic of the array indicates the array is acceptable.

Example 11 is a method for testing an antenna with RF radiating antenna elements of an antenna, the method comprising: obtaining microwave frequency responses from subsets of elements of the antenna array at different times, including exposing each of the subsets to microwave energy using a filter at the different times; and identifying defects in the antenna array based on the microwave frequency responses.

Example 12 is the method of example 11 that may optionally include averaging the microwave frequency responses.

Example 13 is the method of example 11 that may optionally include that positioning the filter comprising an opening over each of the subsets of elements; and capturing a microwave frequency response from said each subset overlapping the hole.

Example 14 is the method of example 13 that may optionally include that the filter comprises an RF absorbing material with the opening.

Example 15 is the method of example 11 that may optionally include aligning the opening with each of the subsets by moving the filter and the first and second antennas.

Example 16 is the method of example 11 that may optionally include that aligning the opening with each of the subsets by moving the array.

Example 17 is the method of example 11 that may optionally include driving the antenna elements in each of the subsets to a resonance frequency at the different times while driving all other elements at a frequency away from the desired frequency.

Example 18 is the method of example 11 that may optionally include identifying defects in the antenna array based on the RF responses by detecting variations in a cell gap of an RF antenna element.

Example 19 is the method of example 11 that may optionally include identifying defects in the antenna array based on the RF responses comprises detecting variations in charging state of an RF antenna element.

Example 20 is the method of example 11 that may optionally include identifying defects in the antenna array based on the RF responses; and rejecting the antenna array for inclusion in the flat panel antenna based on the defects indicating the antenna array does not meet one or more predefined criterion.

Example 21 is the method of example 20 that may optionally include that identifying defects is by detecting line-outs.

Example 22 is the method of example 11 that may optionally include applying microwave energy to an array of antenna elements for use in a flat panel antenna; measuring at least one of the transmitted microwave energy transmitted through the segment or the reflected microwave energy from the array; and analyzing the measured microwave energy to tune one or more elements of the array.

Example 23 is the method of example 22 that may optionally include that tuning one or more RF antenna elements to correct for environmentally induced frequency shifts.

Example 24 is the method of example 23 that may optionally include that the environmentally induced frequency shifts are due to temperature.

Whereas many alterations and modifications of the present invention will no doubt become apparent to a person of ordinary skill in the art after having read the foregoing description, it is to be understood that any particular example shown and described by way of illustration is in no way intended to be considered limiting. Therefore, references to details of various examples are not intended to limit the scope of the claims which in themselves recite only those features regarded as essential to the invention.

What is claimed is:

1. An apparatus comprising:
a frame having a platform to support an array of radio-frequency (RF) antenna elements of a flat panel antenna having antenna elements;
a first antenna to transmit microwave energy to subsets of RF antenna elements of the array and to receive reflected microwave energy from the subsets of RF antenna elements;
a filter between the array and the first antenna, the filter comprising an opening positioned over each of the subsets of RF antenna elements at different times to expose said each of the subsets of RF antenna elements to microwave energy transmitted by the first antenna;
a second antenna to receive microwave energy transmitted though the subsets of RF antenna elements at the different times;
a controller coupled to the subsets of RF antenna elements and to provide at least one stimulus or condition to the subsets of RF antenna elements; and
an analyzer to provide stimulus to the subsets of RF antenna elements and to measure a characteristic of the array using one or both of the first antenna and second antenna.

2. The apparatus of claim 1 wherein the filter comprises an RF absorbing material with the opening.

3. The apparatus of claim 1 further comprising a mechanical structure to move the filter to align the opening with each of the subsets of antenna elements.

4. The apparatus of claim 1 further comprising a mechanical structure to move the array to align the opening with each of the subsets of antenna elements.

5. The apparatus of claim 1 wherein the controller is operable to drive the antenna elements in each of the subsets to a resonance frequency at the different times while driving all other elements at a frequency away from that resonance frequency.

6. The apparatus of claim 1 wherein the analyzer is operable to measure a microwave frequency response at one or both of the first antenna or the second antenna for the array.

7. The apparatus of claim 6 wherein the analyzer is operable to measure a transmission response at the second antenna and a reflection response at the first antenna for the array.

8. The apparatus of claim 7 further comprising:
a computer coupled to the controller and the analyzer and to tune based on at least one of the transmission response or the reflection response for the RF antenna elements in the array.

9. The apparatus of claim 8 wherein the computer is operable to characterize the one or both of the transmission response or the reflection response characteristics for the array.

10. The apparatus of claim 1 wherein the array is used in the flat panel antenna if the measured characteristic of the array indicates the array is acceptable.

* * * * *